(12) United States Patent
Mase

(10) Patent No.: US 12,256,471 B2
(45) Date of Patent: Mar. 18, 2025

(54) APPARATUS FOR HEATING SUBSTRATE AND METHOD THEREOF

(71) Applicant: Tokyo Electron Limited, Tokyo (JP)

(72) Inventor: Takahisa Mase, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 851 days.

(21) Appl. No.: 17/446,667

(22) Filed: Sep. 1, 2021

(65) Prior Publication Data

US 2022/0078888 A1 Mar. 10, 2022

(30) Foreign Application Priority Data

Sep. 10, 2020 (JP) ................. 2020-151978

(51) Int. Cl.
| | |
|---|---|
| *H05B 1/02* | (2006.01) |
| *C23C 16/46* | (2006.01) |
| *C23C 16/52* | (2006.01) |
| *G05D 23/19* | (2006.01) |
| *G05D 23/24* | (2006.01) |
| *H05B 3/22* | (2006.01) |

(52) U.S. Cl.
CPC ........... *H05B 1/0233* (2013.01); *C23C 16/46* (2013.01); *C23C 16/52* (2013.01); *G05D 23/1917* (2013.01); *G05D 23/2401* (2013.01); *H05B 3/22* (2013.01); *H05B 2203/005* (2013.01)

(58) Field of Classification Search
CPC ........ H01L 21/67248; H01L 21/67103; G05D 23/1917; G05D 23/22; G05D 23/2401; C23C 16/52; C23C 16/46; H05B 1/0233; H05B 3/22; H05B 3/283; H05B 2203/005

USPC ........................................................ 219/444.1
See application file for complete search history.

(56) References Cited

U.S. PATENT DOCUMENTS

| | | | | |
|---|---|---|---|---|
| 8,064,233 | B2* | 11/2011 | Ishizu | H05B 1/0233 |
| | | | | 219/664 |
| 8,880,227 | B2* | 11/2014 | Mahadeswaraswamy | ................. |
| | | | | H01L 21/67248 |
| | | | | 700/121 |
| 11,862,489 | B2* | 1/2024 | Morita | H01L 21/67051 |
| 2007/0287201 | A1* | 12/2007 | Ishizu | H05B 1/0233 |
| | | | | 438/10 |
| 2012/0048467 | A1* | 3/2012 | Mahadeswaraswamy | ................. |
| | | | | H01J 37/32522 |
| | | | | 700/282 |

(Continued)

FOREIGN PATENT DOCUMENTS

| | | |
|---|---|---|
| JP | 2006-313779 A | 11/2006 |
| KR | 10-0870565 B1 | 11/2008 |

*Primary Examiner* — Eric S Stapleton
(74) *Attorney, Agent, or Firm* — Armstrong Teasdale LLP

(57) ABSTRACT

An apparatus for heating a substrate includes: a stage including at least one resistance heater that heats the substrate placed thereon; a temperature detector for detecting a heating temperature of the substrate; a temperature calculator for calculating the heating temperature based on a resistance value of the at least one resistance heater; a power controller for performing a power control with respect to a first power to be supplied to the at least one resistance heater such that the heating temperature becomes close to a first preset temperature by switchably applying a phase control and a zero-cross control; and a controller for switching the power control of the power controller to the phase control or the zero-cross control.

12 Claims, 14 Drawing Sheets

(56) References Cited

U.S. PATENT DOCUMENTS

2015/0134128 A1* 5/2015 Mahadeswaraswamy ................... G05B 15/02 700/282
2021/0118706 A1* 4/2021 Morita .............. H01L 21/68792

* cited by examiner

APPARATUS FOR HEATING SUBSTRATE AND METHOD THEREOF

CROSS-REFERENCE TO RELATED APPLICATION

This application is based upon and claims the benefit of priority from Japanese Patent Application No. 2020-151978, filed on Sep. 10, 2020, the entire contents of which are incorporated herein by reference.

TECHNICAL FIELD

The present disclosure relates to an apparatus for heating a substrate, and a method thereof.

BACKGROUND

In manufacturing semiconductor devices, as a heating process for a substrate, a film forming process of forming a film on the substrate, a process of modifying a film formed on the substrate or the like is performed. This heating process is carried out, for example, by placing the substrate on a stage and heating the substrate by a heater. The heating temperature is controlled, for example, by controlling an output of the heater based on an acquired temperature detection value.

Patent Document 1 discloses a technique for controlling heating output, in a heat treatment apparatus, by monitoring the temperature of a wafer using a thermocouple in normal temperature and a low temperature range, and monitoring the temperature of the wafer using a radiation thermometer in a high temperature range.

PRIOR ART DOCUMENT

Patent Document

Patent Document 1: Japanese Laid-Open Patent Publication No. 2006-313779

SUMMARY

According to one embodiment of the present disclosure, there is provided an apparatus for heating a substrate, including: a stage on which the substrate is placed and including at least one resistance heater configured to heat the substrate; a temperature detector configured to detect a heating temperature of the substrate heated by the at least one resistance heater; a temperature calculator configured to calculate the heating temperature based on a resistance value of the at least one resistance heater, which is obtained from a current value and a voltage value of a power supplied to the at least one resistance heater; a power controller configured to perform a power control with respect to a first power to be supplied to the at least one resistance heater such that the heating temperature becomes close to a first preset temperature by applying a phase control and a zero-cross control in a switching manner with respect to a power output from an alternate current (AC) power supply; and a controller, wherein the controller is configured to: switch the power control of the power controller such that, in a low temperature range in which the heating temperature is lower than a preset switching temperature, the power control is performed through the phase control based on a detection result of the heating temperature detected by the temperature detector and, in a high temperature range in which the heating temperature is higher than the preset switching temperature, the power control is performed through the zero-cross control based on a calculation result of the heating temperature calculated by the temperature calculator.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
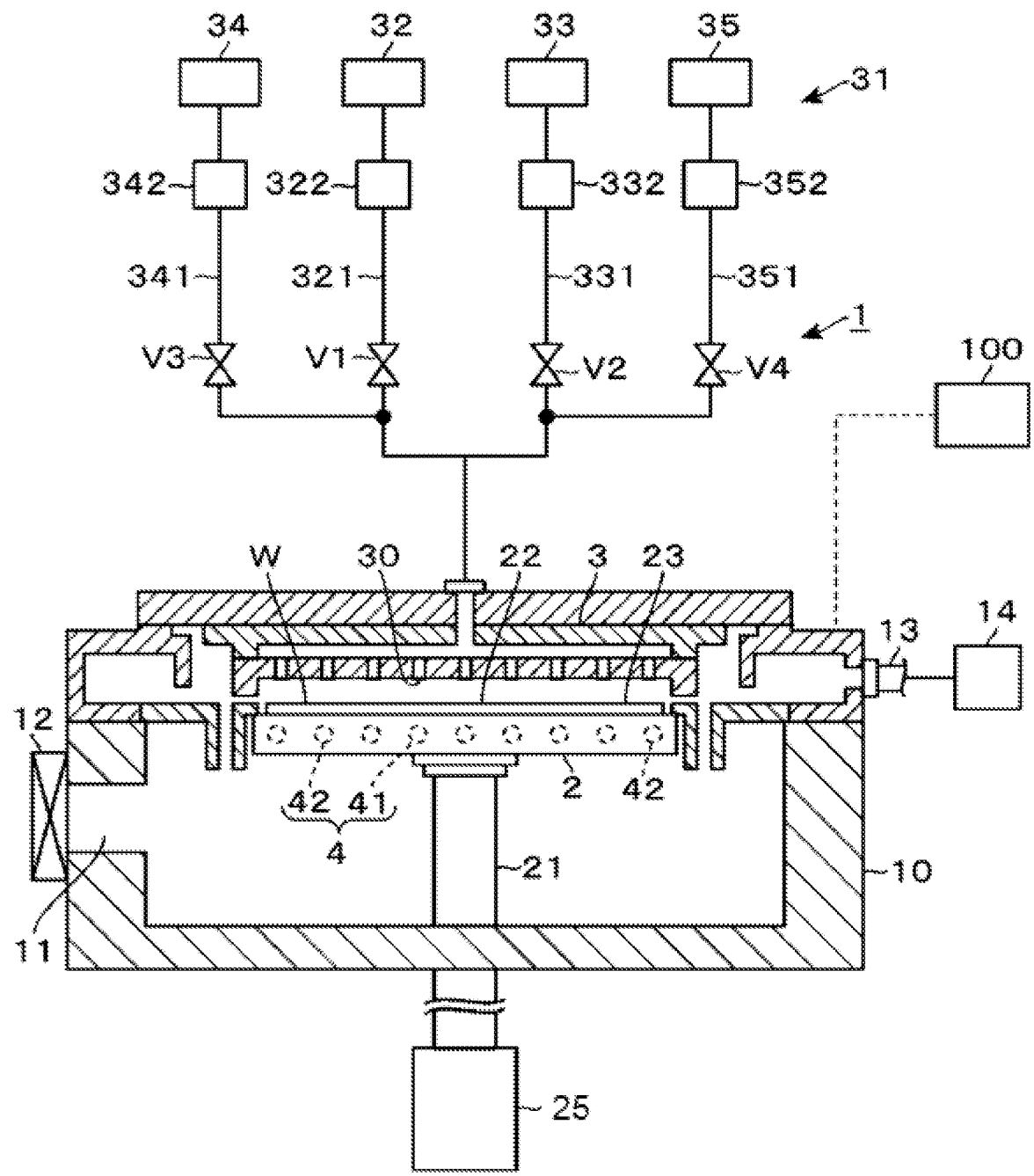
FIG. 1 is a vertical cross-sectional view illustrating a film forming apparatus according to an embodiment of the present disclosure.

A film forming apparatus that is an embodiment of an apparatus for heating a substrate according to the present disclosure (hereinafter, referred to as a "heating apparatus") will be described with reference to FIG. 1. A film forming apparatus 1 includes a processing container 10 in which the substrate (e.g., a semiconductor wafer (hereinafter referred to as a "wafer") W is accommodated. A loading/unloading port 11 through which the wafer W is loaded or unloaded, is formed in the side wall of the processing container to be openable/closable by a gate valve 12. In addition, the processing container 10 is connected to a vacuum exhauster 14 including, for example, a vacuum pump, via a vacuum exhaust path 13.

A stage 2 on which the wafer W is placed is provided inside the processing container 10. For example, the stage 2 is formed in a disk shape and configured to be movable up and down by being connected to a lifting mechanism 25 provided below the processing container 10 via a support member 21.

In addition, the processing container 10 is provided with a shower head 3 so as to face the stage 2. A processing gas supplied from a gas supply system 31 is supplied into the processing container 10 through gas discharge holes 30 formed in a lower surface of the shower head 3.

The gas supply system 31 in this example includes a raw-material gas source 32, a reaction gas source 33, and inert gas sources 34 and 35, which are connected to the processing container 10 via gas supply paths 321, 331, 341, and 351, respectively. In FIG. 1, reference numerals 322, 332, 342, and 352 indicate flow rate adjusters, respectively, and reference numerals V1, V2, V3, and V4 indicate valves, respectively. In a case of forming a silicon carbide (SiC) film, disilane ($Si_2H_6$), which is a silicon precursor gas, may be used as the raw-material gas. In addition, as the reaction gas, bis(trimethylsilyl)acetylene (BTMSA), which is a carbon precursor gas, may be used. In addition, as the inert gas, for example, an Ar gas may be used.

A resistive heater 4 for heating the wafer W is buried in the stage 2. The heater 4 is manufactured by arranging a plurality of resistance heating elements made of a refractory metal in an annular or arcuate plane inside the stage 2 made of a ceramic material such as aluminum nitride (AlN). The heater 4 of this example is divided into a first heater (an inner heater) 41 for heating a first region 22, which is a portion of the wafer W, and a second heater (an outer heater) 42 for heating a second region 23 of the wafer W so as to correspond to regions where the resistance heating elements are provided. The first region 22 is a region set to correspond to a central region of the wafer W. Further, the second region 23 is a region set to correspond to the outer peripheral region of the wafer W, which is different from the central region of the wafer W. The resistance heating elements constituting the inner heater 41 and the outer heater 42 are selected from, for example, molybdenum (Mo), tungsten (W), nickel (Ni), and the like depending on heating process for a target wafer W.

Figure 2:
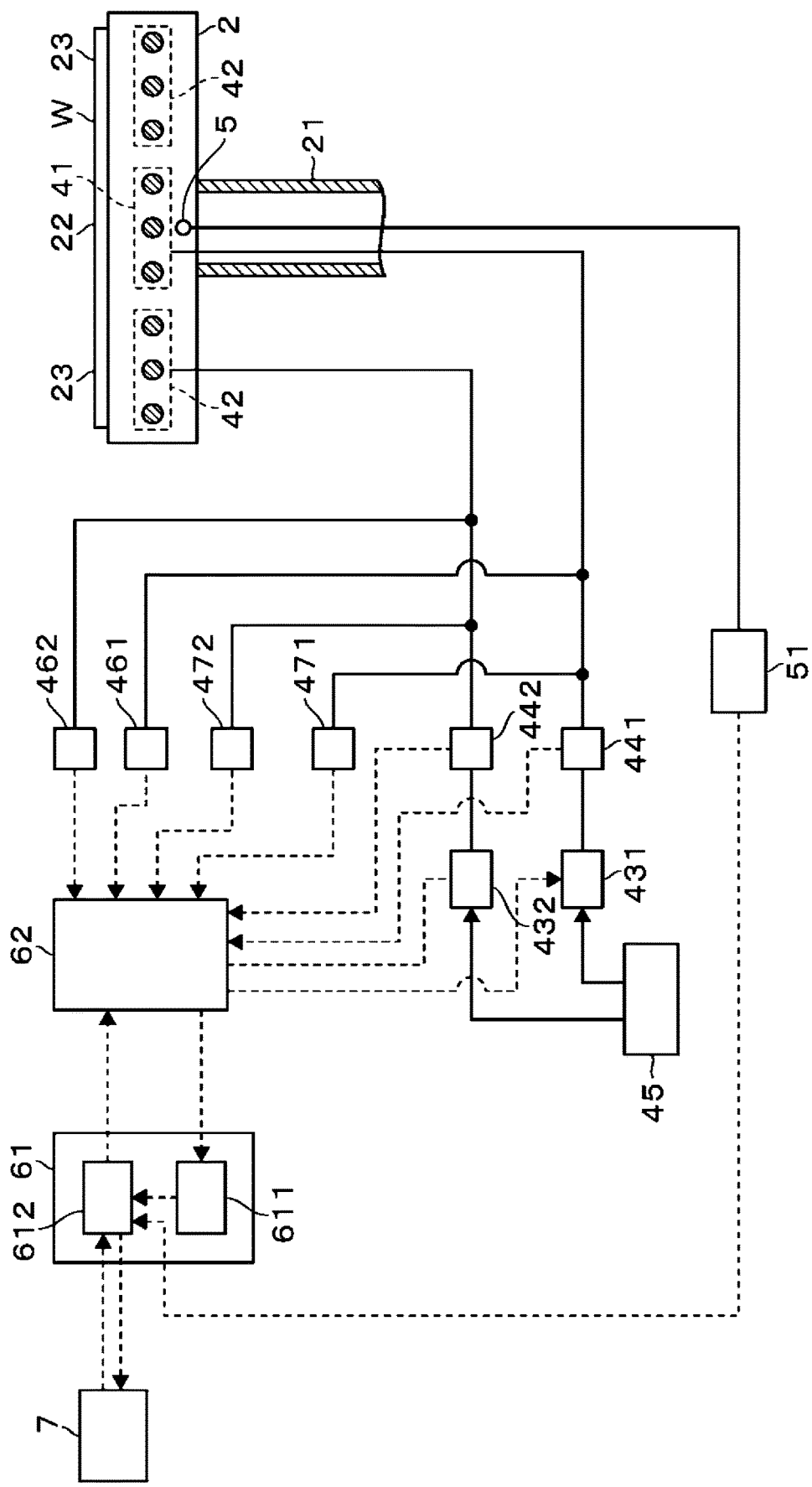
FIG. 2 is a first block diagram illustrating an exemplary configuration of a control system of the film forming apparatus.

As illustrated in FIG. 2, a thermocouple (TC) 5 is provided in the stage 2. The thermocouple 5 constitutes a temperature detector that detects the heating temperature of the wafer W. The thermocouple 5 is arranged such that the tip thereof is located below the inner heater 41, for example, via the inside of the support member 21 of the stage 2. That is, the thermocouple 5 is provided at a position at which the heating temperature of the first region 22 is detected.

Next, a control system of the heater 4 will be described with reference to FIG. 2. The inner heater 41 and the outer heater 42 are connected to an AC power supply 45 via thyristors 431 and 432 and current transformers 441 and 442, respectively. In addition, power meters 461 and 462, and voltmeters 471 and 472 are connected to the inner heater 41 and the outer heater 42, respectively. The thyristors 431 and 432 control, for example, an AC power to be supplied from the AC power supply 45 to the inner heater 41 and the outer heater 42.

An electromotive force generated by the thermocouple 5 according to the heating temperature of the first region 22 is input to an output setting part 612 of a heating controller 61 via a converter 51. The converter 51 has a function of converting the electromotive force of the thermocouple 5 into temperature data. This temperature data corresponds to a heating temperature detection result detected by a temperature detector (the thermocouple 5) (hereinafter, referred to as a "temperature detection value"). The temperature detection value input to the heating controller 61 is input to the output setting part 612 (to be described later) provided in the heating controller 61, and is also output to a main controller 7 (to be described later).

The heating controller 61 is composed of a microcomputer, and includes a temperature calculator 611 and the output setting part 612. The temperature calculator 611 has a function of calculating the heating temperature of the wafer W heated by the heaters 41 and 42 based on resistance values of the powers supplied to the inner heater 41 and the outer heater 42. The heating temperatures of the wafer W by the inner heater 41 and the outer heater 42 are a heating temperature of the first region 22 and a heating temperature of the second region 23, respectively.

Figure 3:
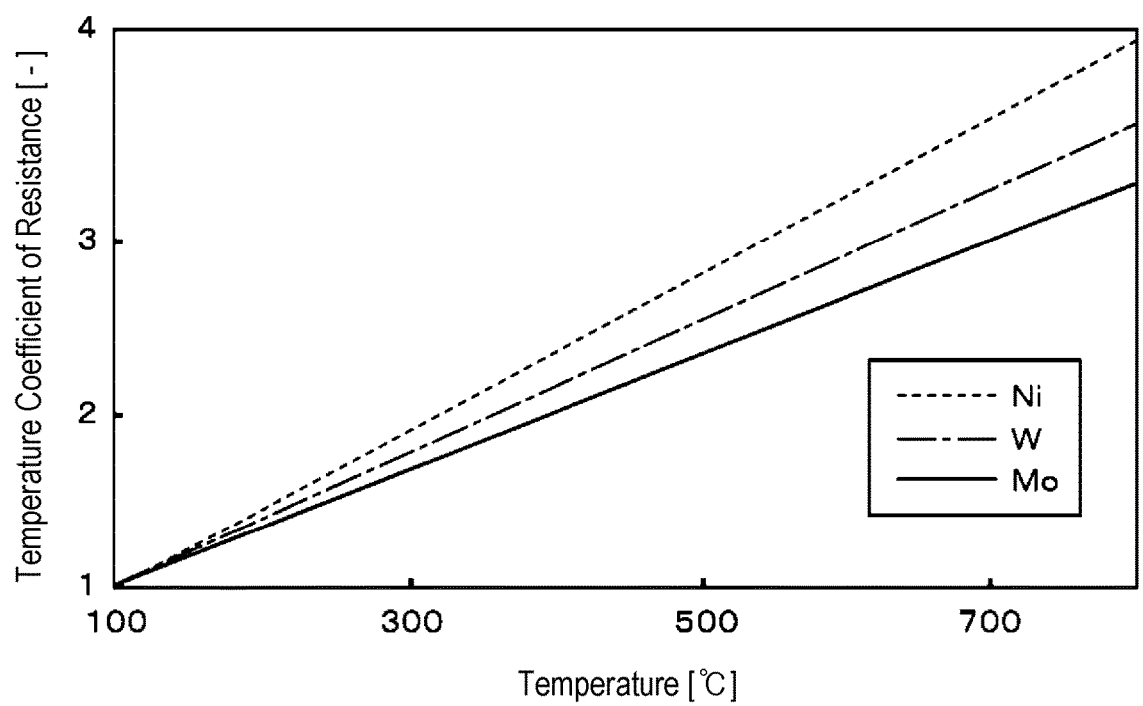
FIG. 3 is a characteristic graph illustrating a temperature-dependent change in temperature coefficient of resistance of a heater provided in the film forming apparatus.

More specifically, the temperature calculator 611 is configured to calculate a temperature using a temperature coefficient of resistance (TCR) obtained from the resistance value. The temperature coefficient of resistance is a ratio of a resistance value at each temperature to a resistance value at a predetermined reference temperature (100 degrees C. in the example illustrated in FIG. 3). As illustrated in FIG. 3, the temperature coefficient of resistance (TCR) increases as the temperature of the heater 4 (the inner heater 41 and the outer heater 42) made of a metal increases. Therefore, it is possible to obtain the heating temperatures of the first and second regions 22 and 23 through calculation based on the resistance values of the inner heater 41 and the outer heater 42. That is, the temperature calculator 611 is able to also calculate the heating temperature of the second region 23 in which the thermocouple 5 is not provided. Here, a result obtained by calculating the heating temperature based on the resistance value of the heater 4 will be referred to as a "TCR-based calculation temperature".

In this example, current values and voltage values of the power supplied to the inner heater 41 and the outer heater 42 are detected by the current transformers 441 and 442 and the voltmeters 471 and 472, respectively, and the detected current values and voltage values are input to the power controller 62. Then, the power controller 62 calculates the resistance value (voltage value/current value) of each of the heaters 41 and 42 and outputs the same to the temperature calculator 611. Then, as illustrated in FIG. 3, the temperature calculator 611 calculates the TCR-based calculation temperature based on the relationship of TCR defined according to the material of the heaters 41 and 42 with the temperature. In addition, the resistance values of the heaters 41 and 42 may be calculated by the temperature calculator 611 (the heating controller 61).

As illustrated in the drawing, a temperature-dependent variation (slope) in TCR differs depending on the type of metal. Therefore, a metal capable of obtaining a TCR-based calculation temperature having a sufficient resolution according to the accuracy or the like required for controlling the processing temperature in the heating process may be selected as a metal constituting the resistance heating element of the heater 4. In this example, molybdenum is used as the resistance heating element.

In the example illustrated in FIG. 3, molybdenum has a smaller temperature-TCR slope than that of nickel or tungsten, so that resolution at the time of calculating the TCR-based calculation temperature. Meanwhile, for nickel or tungsten, it has been found that the temperature-TCR slope gradually changes in a temperature range higher than the range illustrated in FIG. 3. In this respect, this example adopts molybdenum that has a small change in the temperature-TCR slope over a wide temperature range and a stable resolution at the time of calculating the TCR-based calculation temperature.

The output setting part 612 is configured to set powers (supply power values) to be supplied to the inner heater 41 and the outer heater 42 based on the above-described temperature detection value and TCR-based calculation temperature. In this case, the output setting part 612 has a function of setting the supply power values such that the temperature detection value detected using the thermocouple 5 becomes close to a set temperature of a preset heating temperature in a range in which the heating temperature is lower than a preset switching temperature. In addition, the output setting part 612 has function of setting the supply power values such that the TCR-based calculation temperature obtained using the TCR (the resistance value) becomes close to the preset temperature of the preset heating temperature in a range in which the heating temperature is higher than the preset switching temperature.

Based on a command provided from the heating controller 61, the power controller 62 outputs control signals to the thyristors 431 and 432 so as to perform a power control by applying a phase control and a zero-cross control in a switching manner to the power output from the AC power supply 45.

During switching between the phase control and the zero-cross control, the heating controller 61 may be configured to output a signal for selecting one of the phase control and the zero-cross control, together with a signal for setting the supply power values to the power controller 62. Alternatively, the supply power value output from the heating controller 61 may also serve as a switching signal for the phase control and the zero-cross control. In this case, as an example, the power controller 62 may determine the switching such that the phase control is executed in the range in which the supply power value is equal to or less than a preset threshold value and the zero-cross control is executed in the range in which the supply power value is larger than the threshold value. In the following description, the case where the switching between the phase control and the zero-cross control are performed through the latter method will be described.

From the viewpoint of the above-described functions, the heating controller 61 including the output setting part 612 corresponds to a controller of the present disclosure configured to switch the power control of the power controller 62 based on the temperature detection value and the TCR-based calculation temperature.

Figure 4:
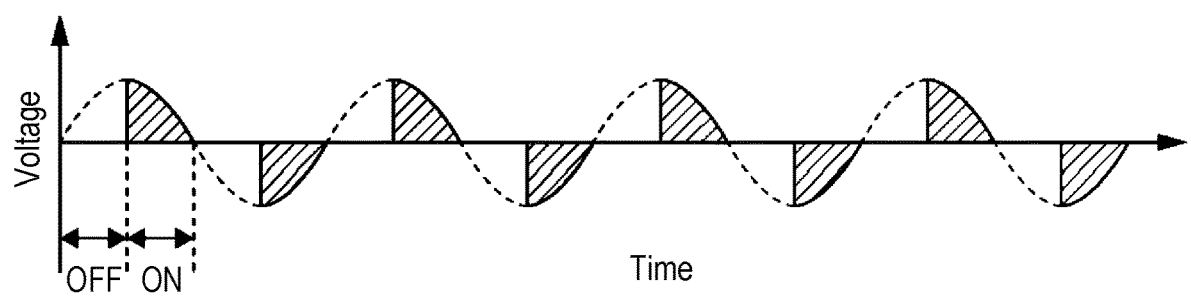
FIG. 4 is a characteristic graph illustrating a phase control performed in the film forming apparatus.

As illustrated in FIG. 4, the phase control is a process of controlling an amount of power to be supplied by changing, for example, a proportion of ON-time for the supply of power from the AC power supply 45 for each cycle using the thyristors 431 and 432. In FIG. 4, the time indicated with diagonal hatched lines is the ON-time during which the power is supplied, the time at which voltage is "zero" is the OFF-time. By increasing the proportion of the ON-time, the amount of power supplied to the heater 4 increases. That is, in FIG. 4, since the proportion of the ON-time is 50%, the proportion of the amount of power to be supplied becomes 50%. Thus, the amount of power to be supplied is precisely controlled by increasing or decreasing the proportion of the ON-time.

Figure 5A:
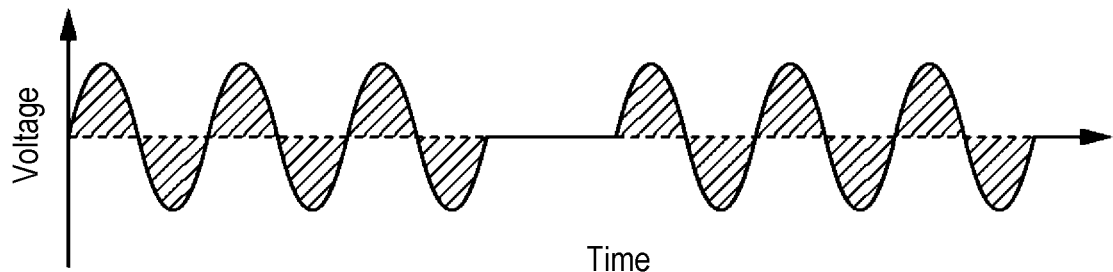
FIGS. 5A to 5C are characteristic graphs each illustrating a zero-cross control performed in the film forming apparatus.
Figure 5B:
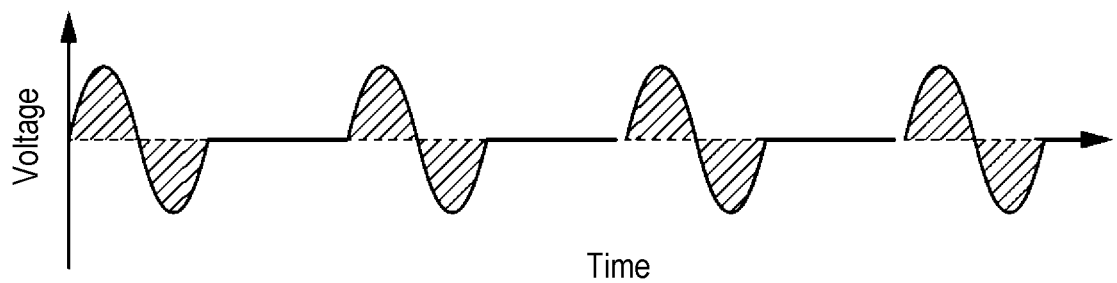
Figure 5C:
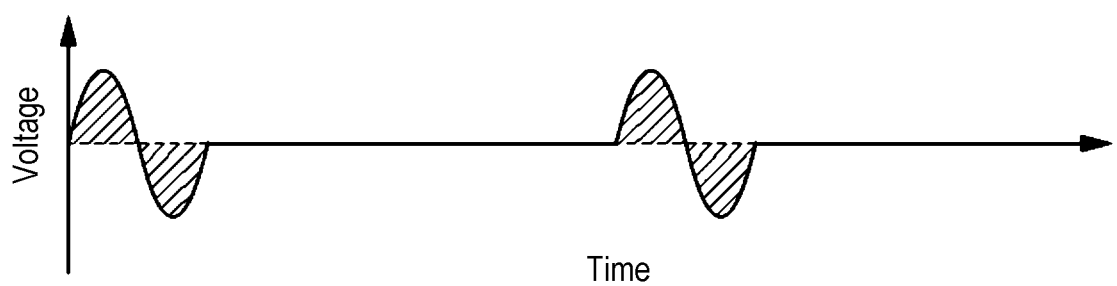

In addition, as illustrated in FIGS. 5A to 5C, the zero cross control is a process of controlling an amount of power to be supplied by setting ON and OFF of power supply in units of one wavelength or half wavelength starting from a position where amplitude is zero and setting a supply section during which power is supplied and a stop section during which no power is supplied using the thyristors 431 and 432. In models illustrated in FIGS. 5A to 5C, in a case in which ON and OFF of the power supply is set in units of one wavelength starting from a position where amplitude is zero, the proportion of the amount of power to be supplied in four wavelengths is set to 100%. Therefore, in the case of three wavelengths illustrated in FIG. 5A, the proportion of the amount of power to be supplied is 75%, in the case of two wavelengths illustrated in FIG. 5B, the proportion of the amount of power to be supplied is 50%, and in the case of one wavelength illustrated in FIG. 5C, the proportion of the amount of power to be supplied is 25%. However, the models illustrated in FIGS. 5A to 5C are provided for the sake of convenience in description. In some embodiments, it is possible to more precisely adjust the output by further increasing or decreasing the wave number of a high frequency.

Further, the film forming apparatus 1 includes the main controller 7. The main controller 7 is constituted with a computer including a CPU and a storage part, and controls each part of the film forming apparatus 1. The storage part stores a program which incorporates a group of steps (instructions) for executing operations required for processing the wafer W, such as heating of the stage 2. This program is stored, for example, in a storage medium, such as a hard disk, a compact disk, a magneto-optical disk, a memory card or the like, and is installed from the storage medium in the computer.

The main controller 7 is configured to output a control command to the heating controller 61 based on the temperature detection value detected at the thermocouple 5 and the TCR-based calculation temperature calculated by the temperature calculator 611 so as to control the heating operation of the heater 4 (the heaters 41 and 42). The contents of the control executed by the heating controller 61 and the power controller 62 will be described in detail together with the actions to be described later.

The main controller 7 is configured such that the preset temperatures of the heater 4 (the heaters 41 and 42), a fixed ratio of the powers to be supplied to the heaters 41 and 42 (to be described later) or the like can be input thereto. When temperature control is performed including a temperature raising process until the temperature is raised to the processing temperature and a temperature lowering process when the temperature is lowered from the processing temperature, the preset temperature may include a temperature and a temperature increasing/lowering rate at each time point, in addition to the processing temperature during the heating process. The preset temperature is set in advance according to, for example, a recipe of the heating process of the wafer W, and is input from the main controller 7 to the output setting part 612.

Next, an example of a film forming process, which is the heating process of the present disclosure and is carried out using the film forming apparatus 1, will be briefly described. Further, the control of power to be supplied to the inner heater 41 and the outer heater 42 will be described in detail later. First, the gate valve 12 is opened, and the wafer W is loaded into the processing container 10 through the loading/unloading port 11 by an external transfer arm (not illustrated) and is placed on the stage 2 inside the processing container 10. Then, in the state in which the gate valve 12 is closed, evacuation is performed using the vacuum exhauster 14 to adjust an internal pressure of the processing container 10 to a pressure required for the film forming process.

Meanwhile, based on a preset temperature raising profile, the stage 2 is gradually heated using the heater 4 from, for example, a temperature equal to or lower than a first temperature T1 (e.g., normal temperature) to, for example, 500 degrees C., which is a temperature at the time of the film forming process. When the heating temperature of the wafer W by the heater 4 reaches the processing temperature, the film forming process is performed on the wafer W. In this film forming process, an adsorption step of supplying a disilane gas, which is a raw-material gas, to the processing container 10 to adsorb disilane onto the wafer W, and a purge step of supplying an Ar gas to the processing container 10 to purge the processing container 10 after stopping the supply of the disilane gas, are performed. Further, a reaction step of supplying a BTMSA gas, which is a reaction gas, to the processing container 10 to cause the disilane adsorbed on the wafer W to react with the BTMSA, and a purge step of supplying an Ar gas to the processing container 10 to purge the processing container 10 after stopping the supply of the BTMSA, are performed. Thereafter, by alternately repeating the adsorption step and the reaction step multiple times, a SiC film is formed by an atomic layer deposition (ALD) method.

After performing the film forming process on the wafer W, the temperature of the heater 4 is lowered based on, for example, a preset temperature lowering profile. Then, when the temperature is lowered to a preset temperature, the internal pressure of the processing container 10 is adjusted to a pressure adapted for the transfer operation of the wafer W. Thereafter, the gate valve 12 is opened. Subsequently, the external transfer arm enters the processing container 10, and the wafer W is unloaded from the processing container 10 in reverse order from when the wafer W was loaded.

Figure 6:
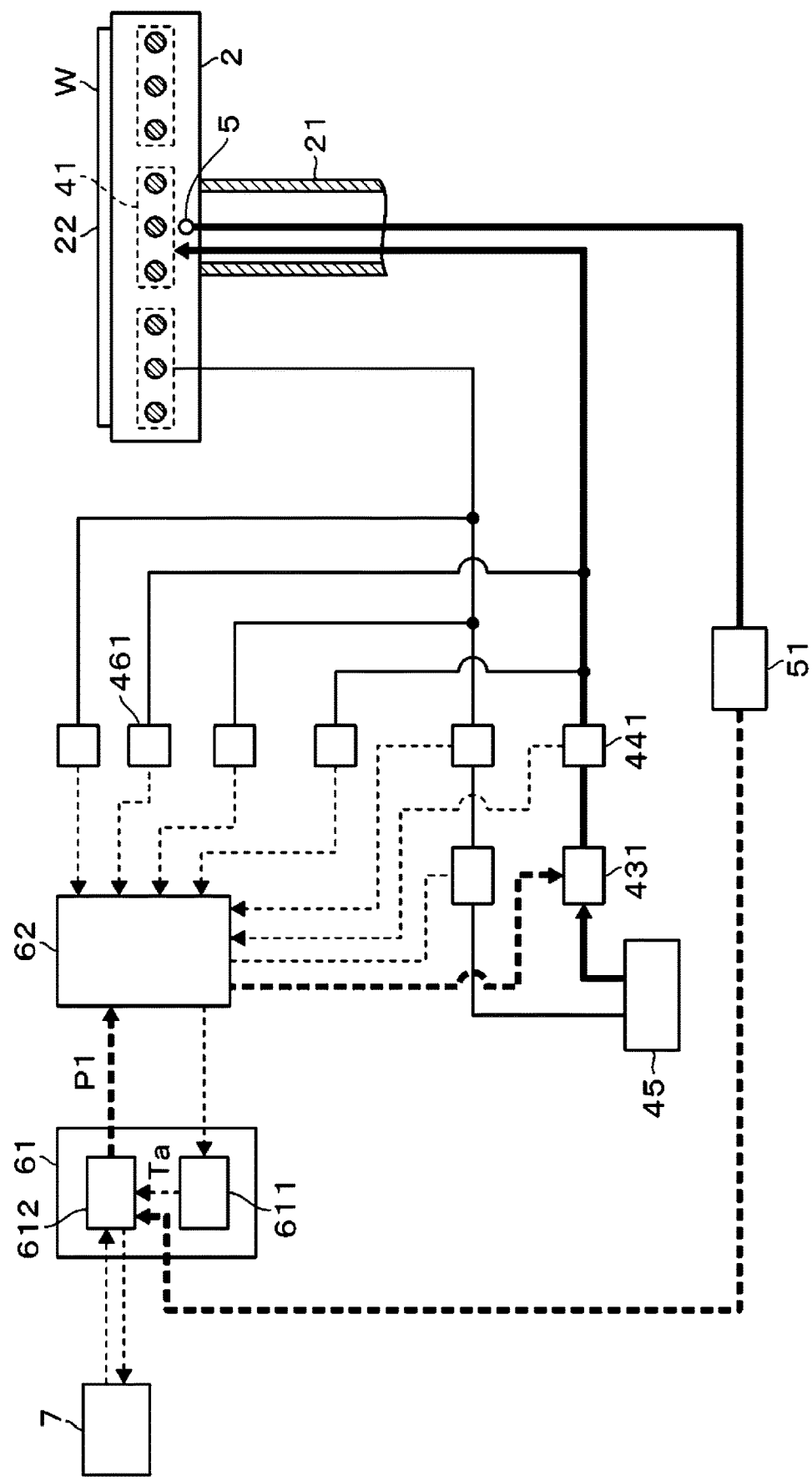
FIG. 6 is a second block diagram illustrating an operation of the film forming apparatus.

Next, the control of power to be supplied to the heater 4 will be further described together with the functions of the heating controller 61 and the power controller 62. First, the control in the temperature range equal to or lower than the first temperature by the inner heater 41 will be described with reference to FIG. 6. The first temperature is an upper limit temperature in a range lower than the switching temperature. In FIG. 6, the power control of the inner heater 41 are indicated by bold solid lines and broken lines. In addition, even in FIGS. 7, 9, and 10, which will be described later, power control to be described is indicated by bold solid lines and broken lines.

In the present disclosure, the control of power to be supplied to the heater 4 is switched between the phase control and the zero-cross control. Such a switching is performed based on the switching temperature. The switching temperature is a temperature that serves as a criterion for switching the power control. The phase control is selected in a temperature range lower than the switching temperature, and the zero-cross control is selected in a temperature range higher than the switching temperature. The switching temperature is set for each heating process according to the type of the heating process or the material of the resistance heating element constituting the heater 4.

The heating controller 61 outputs a command to the power controller 62 to perform the power control using the phase control based on the temperature detection value Ta of the thermocouple 5 in the temperature range equal to or lower than the first temperature T1.

Since the resistance heating element constituting the heater 4 has a large TCR, the resistance value is low at a low temperature, as illustrated in FIG. 3. Thus, in order to suppress the flow of a large current, the phase control is preferable as a heating control method. However, in the phase control, as illustrated in FIG. 4, since the output voltage becomes a non-sinusoidal wave, the accuracy of measurement of the TCR-based calculation temperature obtained using the TCR may be reduced. Meanwhile, the temperature detection value Ta of the thermocouple 5 has high measurement accuracy in a wide temperature range, except for a point the thermocouple 5 is not provided in the second region 23 (a point where the temperature detection value of the second region 23 cannot be directly acquired). Therefore, in the low temperature range in which the phase control is required, the temperature is detected using the thermocouple 5, and the power of the inner heater 41 is controlled based on the temperature detection value Ta. For example, in the temperature range from the normal temperature to about 300 degrees C., the use of the phase control enables a relatively high accuracy of temperature control. In this case, the first temperature, which is the upper limit temperature in the temperature range lower than the switching temperature, is set to 300 degrees C. described above.

The control operation in this case will be described with reference to FIG. 6. The temperature detection value Ta of the thermocouple 5 is input to the output setting part 612 of the heating controller 61, and the temperature detection value Ta is also output to the main controller 7. The output setting part 612 compares the temperature detection value Ta with a preset temperature, and sets a value of power to be supplied to the inner heater 41 such that the temperature detection value Ta becomes close to the preset temperature. When a set value P1 of the power to be supplied is output to the power controller 62, the power controller 62 determines that the set value P1 falls within a range of a set value for executing the phase control, and controls the operation of the thyristor 431 based on the set value P1.

Specifically, the power controller 62 feedback-controls, through the phase control using the thyristor 431, the power to be supplied to the inner heater 41 such that a power detection value at the outlet of the current transformer 441 becomes close to the set value P1. As a result, the power to be supplied to the inner heater 41 is controlled such that the temperature detection value Ta of the thermocouple 5 becomes close to the preset temperature.

Subsequently, the control in the temperature range equal to or higher than the second temperature using the inner heater 41 will be described with reference to FIG. 7. The second temperature is a lower limit temperature in a range higher than the switching temperature, and is higher than the first temperature.

In the temperature range equal to or higher than the second temperature, the heating controller 61 outputs a command to the power controller 62 to perform the power control using the zero-cross control based on the calculation result of the heating temperature of the first region 22 calculated by the temperature calculator 611 (a TCR-based calculation temperature Tb).

For example, in the temperature range equal to or higher than 300 degrees C., as illustrated in FIG. 3, the resistance value of the heater 4 becomes high and the possibility of the flow of a large current is small. Thus, the temperature control can be precisely performed even if the zero-cross control is adopted. Further, in the zero-cross control, as illustrated in FIGS. 5A to 5C, since the output voltage is a sine wave, the accuracy of measurement of the resistance value is high, and thus it is possible to calculate the temperature with high accuracy based on the resistance value. For this reason, in the high temperature range, the power control can be performed using the zero-cross control as the heating control method based on the TCR-based calculation temperature Tb. Therefore, in this example, the second temperature, which is obtained by adding the switching temperature range (450 degrees C.) to the first temperature (300 degrees C.) described above, is set to 350 degrees C., and in the temperature range equal to or higher than the second temperature, the power control is performed using the zero-cross control based on the TCR-based calculation temperature Tb.

Figure 7:
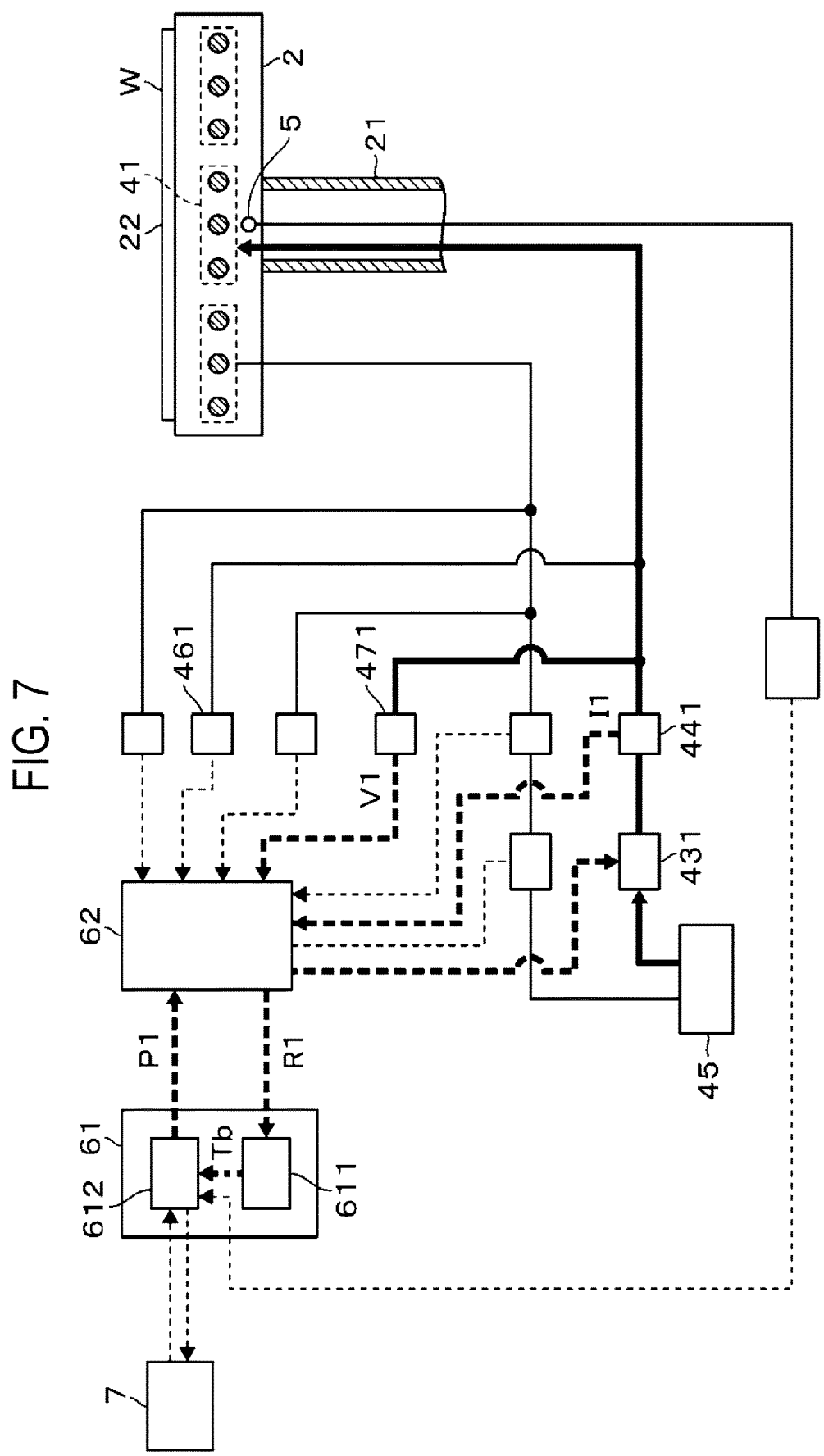
FIG. 7 is a third block diagram illustrating an operation of the film forming apparatus.

In this case, as illustrated in FIG. 7, regarding the power to be supplied to the inner heater 41, the current transformer 441 and the voltmeter 471 detect a current value I1 and a voltage value V1, respectively, and output the same to the power controller 62. Then, the power controller 62 obtains a resistance value R1 (the voltage value V1/the current value I1) of the inner heater 41, and the temperature calculator 611 of the heating controller 61 calculates the TCR-based calculation temperature Tb based on the resistance value R1. The TCR-based calculation temperature Tb is a heating temperature (heating temperature of the first region 22) of the wafer W by the inner heater 41, and is output to the output setting part 612 and the main controller 7.

The output setting part 612 compares the TCR-based calculation temperature Tb with a preset temperature and sets a value of power to be supplied to the inner heater 41 such that the TCR-based calculation temperature Tb becomes close to the preset temperature. When the set value P1 of the power to be supplied is output to the power controller 62, the power controller 62 determines that the set value P1 falls within a range of a set value for executing the zero-cross control, and controls the operation of the thyristor 431 based on the set value P1.

Specifically, the power controller 62 feedback-controls, through the zero-cross control using the thyristor 431, the power to be supplied to the inner heater 41 such that a power detection value at the outlet of the current transformer 441 becomes close to the set value P1. As a result, the power to be supplied to the inner heater 41 is controlled such that the TCR-based calculation temperature Tb becomes close to the preset temperature.

Figure 8:
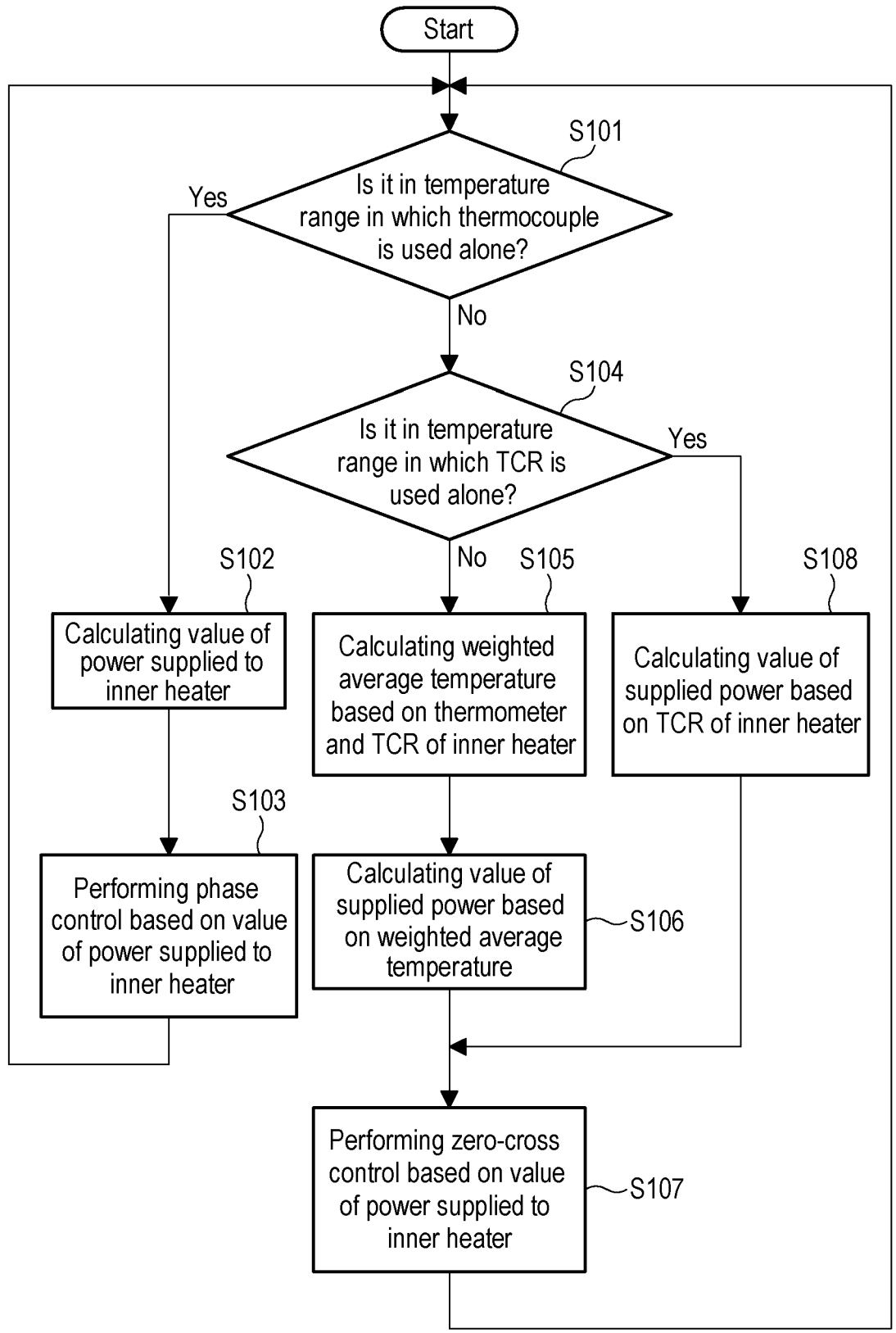
FIG. 8 is a first flowchart illustrating an operation of the film forming apparatus.

The heating control at the time of raising the temperature of the inner heater 41 in the flow of the control operation described above will be described with reference to the flowchart of FIG. 8. First, based on the temperature detection value Ta of the thermocouple 5, the heating controller 61 determines whether or not the temperature is in the temperature range in which the thermocouple 5 is used alone, that is, whether or not the temperature is equal to or lower than the first temperature (300 degrees C. in this example) ("YES" in step S101). When the temperature detection value Ta is equal to or lower than the first temperature, the process proceeds to step S102. Then, as described above with reference to FIG. 6, the value of power to be supplied to the inner heater 41 is calculated, and the phase control is executed based on the calculated value of power to be supplied (step S103).

Meanwhile, when the temperature detection value Ta is higher than the first temperature ("NO" in step S101), the process proceeds to step S104 where it is determined whether or not the temperature detection value Ta falls within the temperature range in which the TCR is used alone, that is, whether the TCR-based calculation temperature Tb is equal to or higher than the second temperature (in this example, 350 degrees C.). When the TCR-based calculation temperature Tb is equal to or higher than the second temperature ("YES" in step S104), the process proceeds to step S108. Then, as described above with reference to FIG. 7, the value of power to be supplied to the inner heater 41 is calculated, and the zero-cross control is executed based on the value of power to be supplied (step S107).

When the TCR-based calculation temperature Tb is lower than the second temperature ("NO" in step S104), the process proceeds to step S105 where a weighted average temperature is calculated based on the temperature detection value Ta and the TCR-based calculation temperature Tb. Then, the value of power to be supplied to the inner heater 41 is calculated from the weighted average temperature (step S106), and the zero-cross control is executed based on the value of power to be supplied (step S107). The control based on the weighted average temperature in steps S105 and S106 will be described later.

Figure 9:
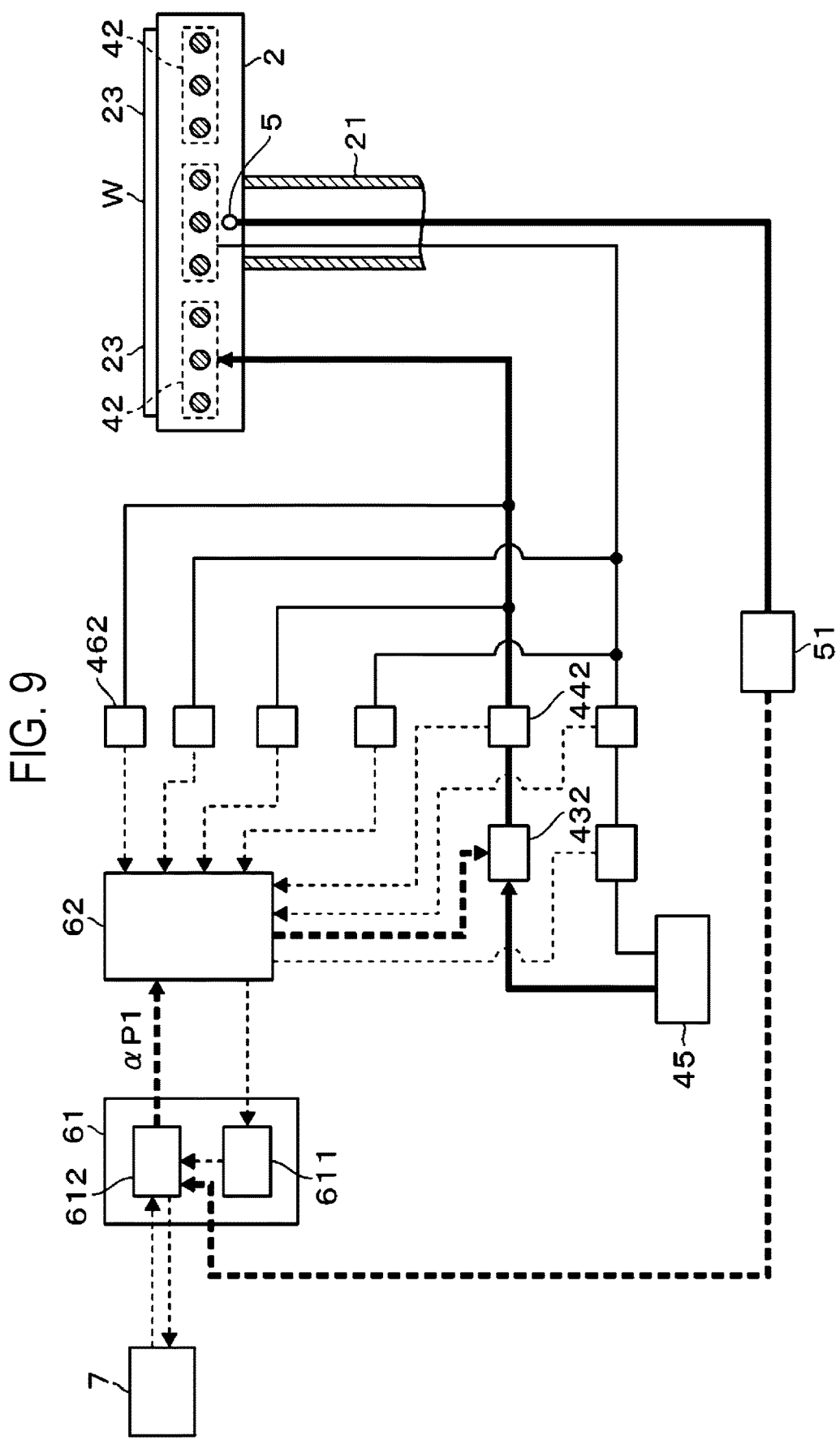
FIG. 9 is a fourth block diagram illustrating an operation of the film forming apparatus.
Figure 10:
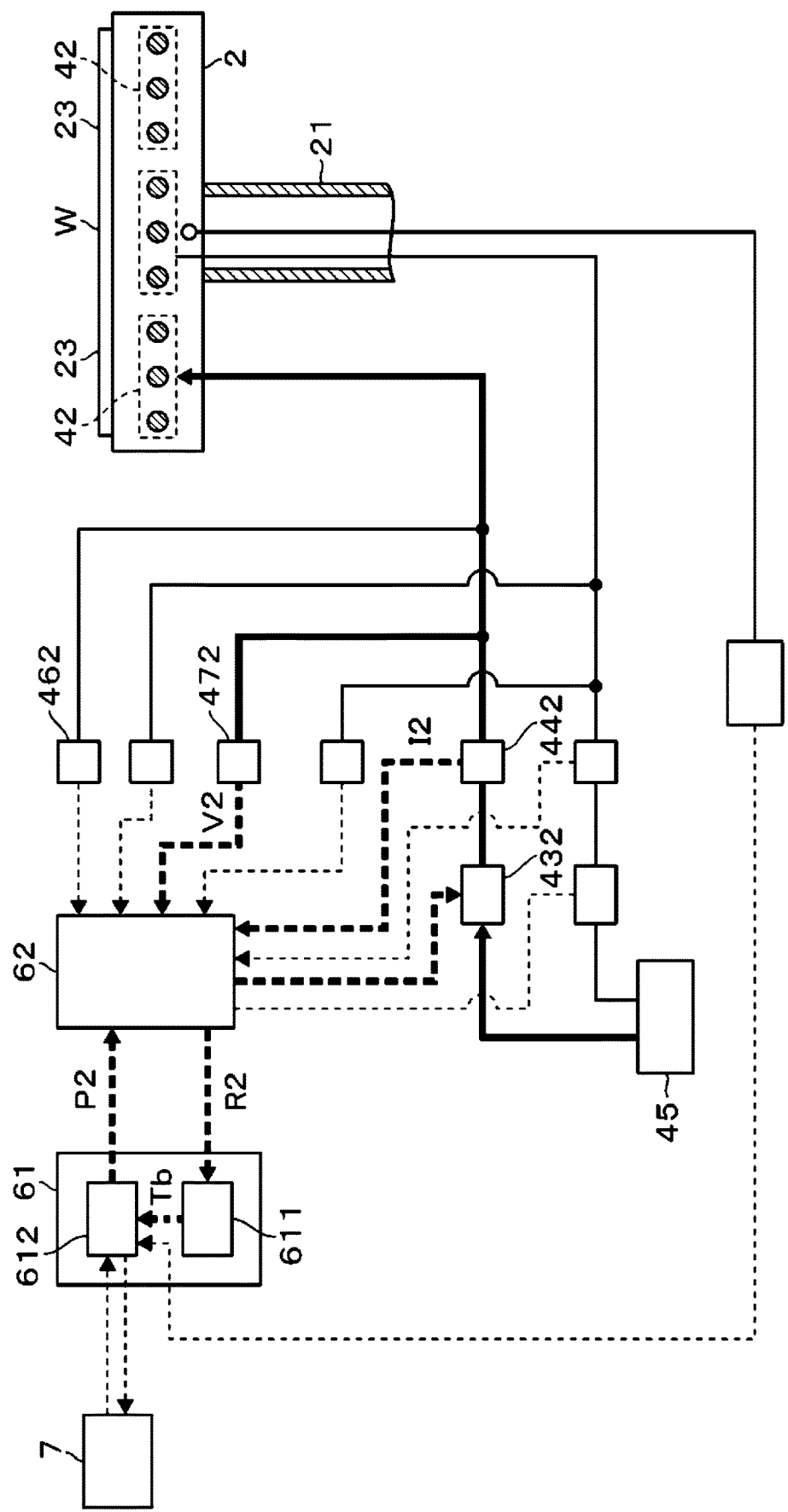
FIG. 10 is a fifth block diagram illustrating an operation of the film forming apparatus.
Figure 11:
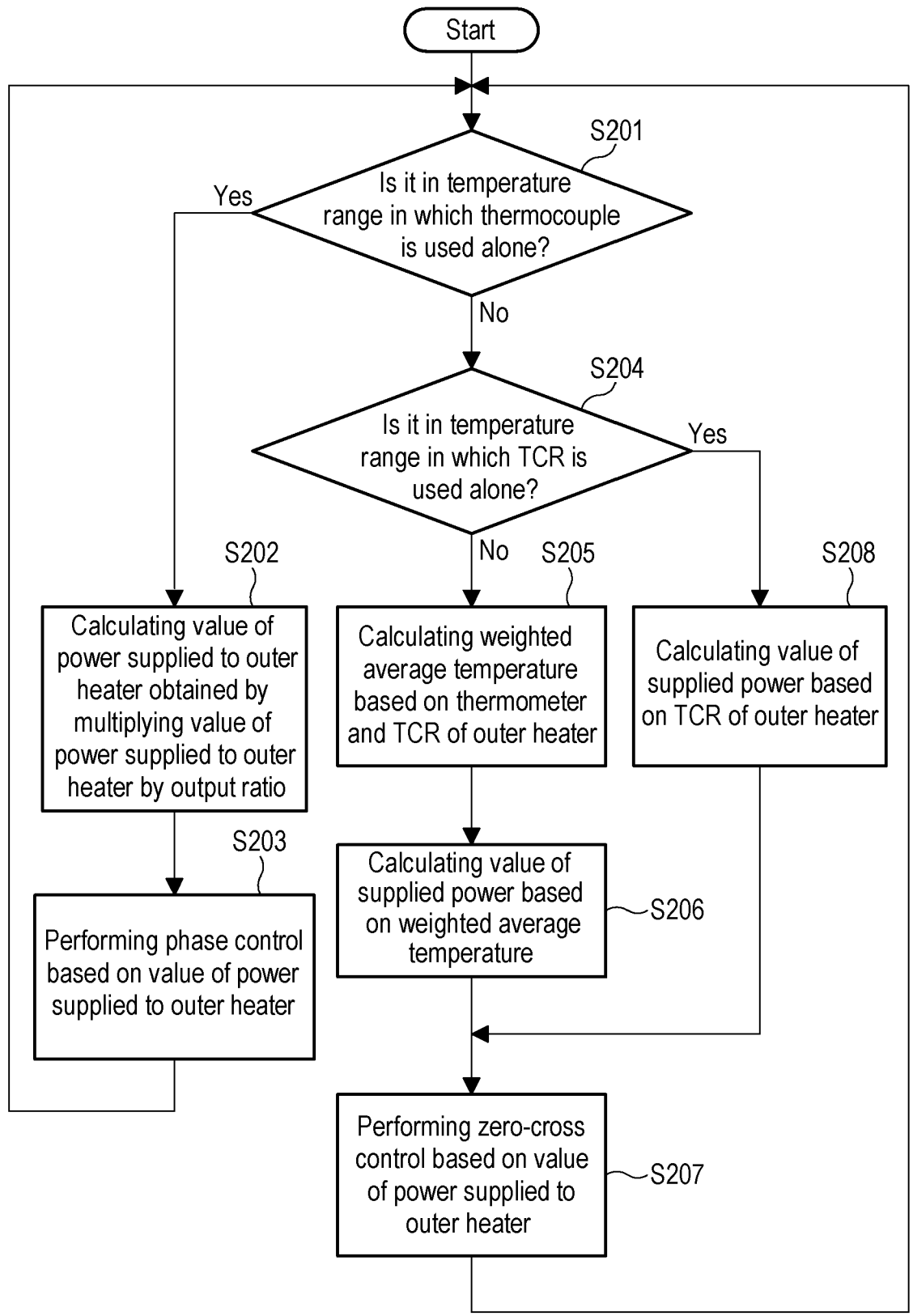
FIG. 11 is a second flowchart illustrating an operation of the film forming apparatus.

Next, the control of power to be supplied to the outer heater 42 provided in the second region 23 in which the thermocouple 5 is not provided will be described with reference to FIGS. 9 to 11. First, control in the temperature range equal to lower than the first temperature will be described with reference to FIG. 9. In the temperature range equal to or lower than the first temperature, the heating controller 61 outputs a command to the power controller 62 to perform power control through the phase control with respect to the outer heater 42 based on the result of the power control performed for the inner heater 41.

The expression "based on the result of power control performed for the inner heater 41" used in this example means that a set value $\alpha \cdot P1$ obtained by multiplying the set value P1 of the power to be supplied to the inner heater 41 described with reference to FIG. 6 by a fixed ratio $\alpha$ is set as a value of power to be supplied to the outer heater 42. In this example, since the thermocouple 5 is not provided in the region corresponding to the second region 23, it is impossible to obtain the temperature detection value Ta in the second region 23. Meanwhile, during the execution of the phase control, it is also difficult to use the TCR-based calculation temperature Tb, which has low measurement accuracy.

Therefore, during the execution of the phase control, the outer heater 42 is controlled based on the detection result of the heating temperature of the first region 22 detected by the thermocouple 5. Since there is a correlation between the heating temperature of the first region 22 and the heating temperature of the second region 23, it is possible to estimate the heating temperature of the second region 23 by multiplying the temperature detection value of the thermocouple 5 by the fixed ratio. Therefore, by acquiring the fixed ratio $\alpha$ in advance, it is possible to set the value of power to be supplied to the outer heater 42 "based on the result of the power control performed for the inner heater 41".

The power controller 62 determines that the set value $\alpha \cdot P1$ falls within the range of the set value for executing the phase control, and controls the operation of the thyristor 432 based on the set value $\alpha \cdot P1$. That is, the power controller 62 feedback-controls, through the phase control using the thyristor 432, the power to be supplied to the outer heater 42 such that the power detection value at the outlet of the current transformer 442 becomes close to the set value $\alpha \cdot P1$.

Subsequently, the control in the temperature range equal to or higher than the second temperature using the outer heater 42 will be described with reference to FIG. 10. In the temperature range equal to or higher than the second temperature, the heating controller 61 outputs a command to the power controller 61 to perform power control through the zero-cross control based on the calculation result of the heating temperature of the second region 23 by the temperature calculator 611 (the TCR-based calculation temperature Tb). In this power control, the heating temperature of the second region 23 is controlled to approach a preset temperature.

In this case, regarding the power supplied to the outer heater 42, the current transformer 442 and the voltmeter 472 detect the current value I2 and the voltage value V2, respectively, and output the same to the power controller 62. The power controller 62 calculates a resistance value R2 of the outer heater 42 based on the current value I2 and the voltage value V2. Subsequently, the temperature calculator 611 calculates the heating temperature (the TCR-based calculation temperature Tb) of the second region 23 based on the resistance value R2, and outputs the same to the output setting part 612 and the main controller 7.

The output setting part 612 compares the TCR-based calculation temperature Tb with a preset temperature and sets a value of power to be supplied to the outer heater 42 such that the TCR-based calculation temperature Tb becomes close to the preset temperature. When the set value P2 of the power to be supplied is output to the power controller 62, the power controller 62 determines that the set value P2 falls within the range of the set value for executing the zero-cross control, and controls the operation of the thyristor 432 based on the set value P2.

Specifically, the power controller 62 feedback-controls, through the zero-cross control using the thyristor 432, the power to be supplied to the outer heater 42 such that the power detection value at the outlet of the current transformer 442 becomes close to the set value P2. As a result, the power to be supplied to the outer heater 42 is controlled such that the TCR-based calculation temperature Tb becomes close to the preset temperature.

The heating control at the time of raising the temperature of the outer heater 42 in the flow of the control operation described above will be described with reference to the flowchart of FIG. 11. First, based on the temperature detection value Ta of the thermocouple 5, the heating controller 61 determines whether or not the temperature is in the temperature range in which the thermocouple 5 is used alone, that is, whether or not the temperature is equal to or lower than the first temperature ("YES" in step S201). When the temperature detection value Ta is equal to or lower than the first temperature, the process proceeds to step S202. Then, as described above with reference to FIG. 9, a value of power to be supplied to the outer heater 41 is calculated by multiplying the value of power to be supplied to the inner heater 41 by an output ratio, and the phase control is executed based on the calculated value of power to be supplied (step S203).

Meanwhile, when the temperature detection value Ta is higher than the first temperature ("NO" in step S201), the process proceeds to step S204 where it is determined whether or not the temperature detection value Ta falls within the temperature range in which the TCR is used alone, that is, whether the TCR-based calculation temperature Tb is equal to or higher than the second temperature. When the TCR-based calculation temperature Tb is equal to or higher than the second temperature ("YES" in step S204), the process proceeds to step S208. Then, as described above with reference to FIG. 10, the value of power to be supplied to the outer heater 42 is calculated, and the zero-cross control is executed based on the calculated value of power to be supplied (step S207).

When the TCR-based calculation temperature Tb is lower than the second temperature ("NO" in step S204), the process proceeds to step S205 where a weighted average temperature is calculated from the temperature detection value Ta and the TCR-based calculation temperature Tb. Then, the value of power to be supplied to the outer heater 42 is calculated based on the weighted average temperature (step S206), and the zero-cross control is executed based on the calculated value of power to be supplied (step S207).

The heating controller 61 of this example controls the power controller 62 to perform the power control by, for example, the zero cross control, based on a transition temperature in a switching temperature range between the first temperature and the second temperature. The transition temperature used herein is a temperature between the temperature detection value Ta of the thermocouple 5 and the TCR-based calculation temperature Tb calculated by the temperature calculator 611, for example, the weighted average temperature of the temperature detection value Ta and the TCR-based calculation temperature Tb.

Next, the weighted average temperature calculated by the temperature calculator 611 will be described by taking the inner heater 41 as an example. The temperature calculator 611 outputs the weighted average temperature of the temperature detection value Ta and the TCR-based calculation temperature Tb when the temperature detection value Ta is higher than the first temperature T1 and the TCR-based calculation temperature Tb is lower than the second temperature T2. In this case, a weight of the weighted average temperature is changed such that the closer the weighted average temperature is to the first temperature, the more the proportion of the temperature detection value Ta increases, and the closer the weighted average temperature is to the second temperature, the more the proportion of the TCR-based calculation temperature Tb increases.

Regarding the weighted average temperature, for example, the temperature calculator 611 calculates a weighted average temperature T' based on the following Equation (1). Equation (1) is an example in which the weight of the weighted average temperature is linearly changed according to a change in the temperature detection value Ta of the thermocouple 5.

$$T'=\{1-(Ta-T1)/(T2-T1)\}Ta+\{(Ta-T1)/(T2-T1)\}Tb \qquad (1)$$

Ta: temperature detection value of thermocouple (the detection result of the heating temperature detected by the temperature detector)

Tb: TCR-based calculation temperature (the calculation result of the heating temperature calculated by the temperature calculator)

T1: first temperature

T2: second temperature

In Equation (1), the closer the temperature detection value Ta is to the first temperature T1, the more the coefficient of Ta increases and the coefficient of Tb decreases. Substituting the first temperature T1 as Ta yields T'=Ta. In addition, the closer the temperature detection value Ta is to the second temperature T2, the more the coefficient of Ta decreases and the coefficient of Tb increases. Substituting the second temperature T2 as Ta yields T'=Tb. In this way, in Equation (1), the weight of the weighted average temperature T' is changed such that the closer the weighted average temperature T' is to the first temperature T1, the more the proportion of the temperature detection value Ta increases, and the closer the weighted average temperature T' is to the second temperature T2, the more the proportion of the TCR-based calculation temperature Tb increases.

As described above with reference to the flowchart of FIG. 8, the temperature calculator 611 outputs the weighted average temperature as the transition temperature to the output setting part 612 in the temperature range higher than the first temperature and lower than the second temperature (step S105). In addition, the output setting part 612 calculates the value of power to be supplied such that the transition temperature becomes close to the preset temperature, and outputs a command to the power controller 62 to perform the power control using the zero-cross control (step S106). In this way, the zero-cross control is executed based on the calculation value of power to be supplied to the inner heater 41 (step S107).

Regarding the heating control of the outer heater 42, in the switching temperature range, the output setting part 612 calculates the value of power to be supplied such that the transition temperature becomes close to the preset temperature, and outputs a command for power control through, for example, the zero-cross control. The transition temperature is a temperature between a temperature obtained from the temperature detection value Ta of the first region 22 by the thermocouple 5 and the TCR-based calculation temperature Tb of the second region 23, and is, for example, a weighted average temperature of the temperature obtained from the temperature detection value Ta and the TCR-based calculation temperature Tb. The temperature obtained from the temperature detection value Ta is the temperature detection value Ta of the first region 22 in this example, but may be a temperature obtained by multiplying the temperature detection value Ta by a fixed coefficient determined in advance.

Then, as in the case of the inner heater 41, the temperature calculator 611 is configured to output the weighted average temperature when the temperature detection value Ta is higher than the first temperature and the TCR-based calculation temperature Tb is lower than the second temperature. The weighted average temperature is calculated based on the above-mentioned Equation (1) when the temperature obtained from the temperature detection value Ta is the temperature detection value Ta.

Then, as described with reference to the flowchart illustrated in FIG. 11, the temperature calculator 611 outputs the weighted average temperature as the transition temperature to the output setting part 612 in the temperature range described above (step S205). Then, the output setting part 612 calculates the value of power to be supplied such that the transition temperature becomes close to the preset temperature, and outputs a command to the power controller 62 to perform the power control through the zero-cross control (step S206). In this way, the zero-cross control is executed based on the calculated value of power to be supplied (step S207).

In the example described above, the reason for executing the control through the zero-cross control in the switching temperature range is to carry out more precise power control. That is, in the temperature range higher than the first temperature, the zero-cross control and the acquisition of the TCR-based calculation temperature Tb based on the resistance value are possible. Therefore, the power control performed by estimating the heating temperature using the fixed ratio α in the outer heater 42 is terminated, and the heating temperature acquisition method and the power control method are switched. Corresponding to such a switching, the inner heater 41 also switches to the zero-cross control based on the weighted average temperature.

Although the control of the power to be supplied to raise the temperature of the heater 4 has been described above, the control of the power to be supplied may be similarly performed in the same manner even when lowering the temperature of the heater 4.

Here, FIGS. 12 to 15 schematically illustrate examples in which the output of the heater 4 is controlled based on the weighted average temperature T' calculated using Equation (1) above. In FIGS. 12 to 15, the horizontal axis represents the time, the vertical axis represents the temperature, the solid line indicates a control temperature Tc, the one-dot chain line indicates the temperature detection value Ta, and the broken line indicates the TCR-based calculation temperature Tb. The control temperature Tc is a target temperature set for the output setting part 612 by the main controller 7 so as to approach a set temperature when controlling the power to be supplied to the heater 4 based on the preset temperature and the temperature detection value Ta or the TCR-based calculation temperature Tb.

Figure 12:
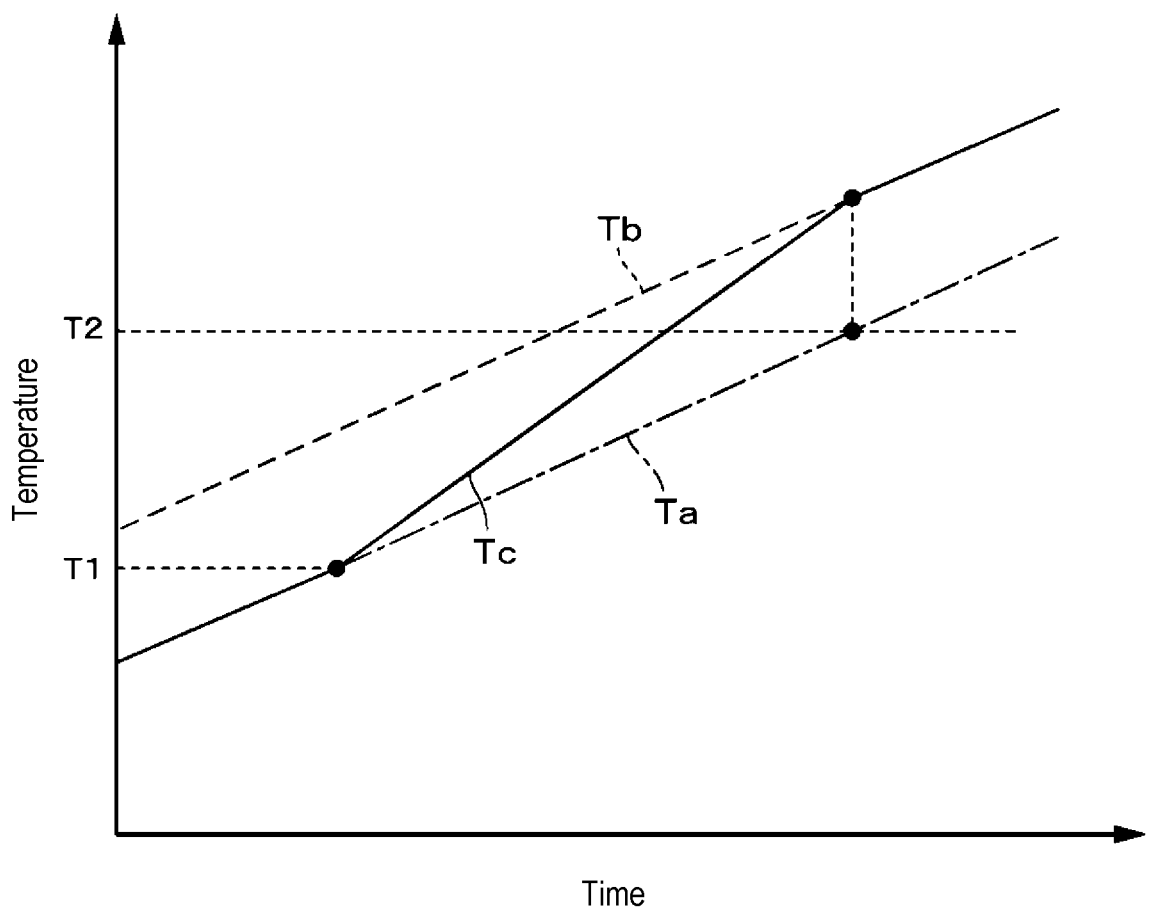
FIG. 12 is a first characteristic graph illustrating an operation of the film forming apparatus.

FIG. 12 illustrates an example in which the temperature detection value Ta is detected to be lower than the TCR-based calculation temperature Tb when the preset temperature is raised linearly with time. In the temperature range in which the temperature detection value Ta is lower than the first temperature T1, the power to be supplied to the heater 4 is controlled based on the temperature detection value Ta such that the temperature detection value Ta becomes close to the preset temperature. In addition, in the temperature range in which the TCR-based calculation temperature Tb is higher than the second temperature T2, the power to be supplied to the heater 4 is controlled based on the TCR-based calculation temperature Tb such that the TCR-based calculation temperature Tb becomes close to the preset temperature.

When responsiveness to the heating by the heater 4 is sufficiently fast, the temperature detection value Ta, the TCR-based calculation temperature Tb, and the control temperature Tc substantially coincide with each other. Assuming such an ideal case, FIGS. 12 to 15 schematically illustrate the state in which there is no a lag in responsiveness and these temperatures Ta and Tb coincide with the control temperature Tc. Form these drawings, it can be seen that the power control is performed based on the temperature detection value Ta in the temperature range lower than the first temperature T1, and the power control is performed based on the TCR-based calculation temperature Tb in the temperature range higher than the second temperature T2.

Meanwhile, when the temperature detection value Ta is higher than the first temperature T1 and the TCR-based calculation temperature Tb falls within the temperature range lower than the second temperature T2, the power to be supplied to the heater 4 is controlled based on the weighted average temperature T' calculated using Equation (1) above. Since the weight of the weighted average temperature is adjusted as described above, the power to be supplied to the heater 4 is controlled while linearly raising the control temperature Tc from the first temperature T1 to the second temperature T2.

Figure 13:
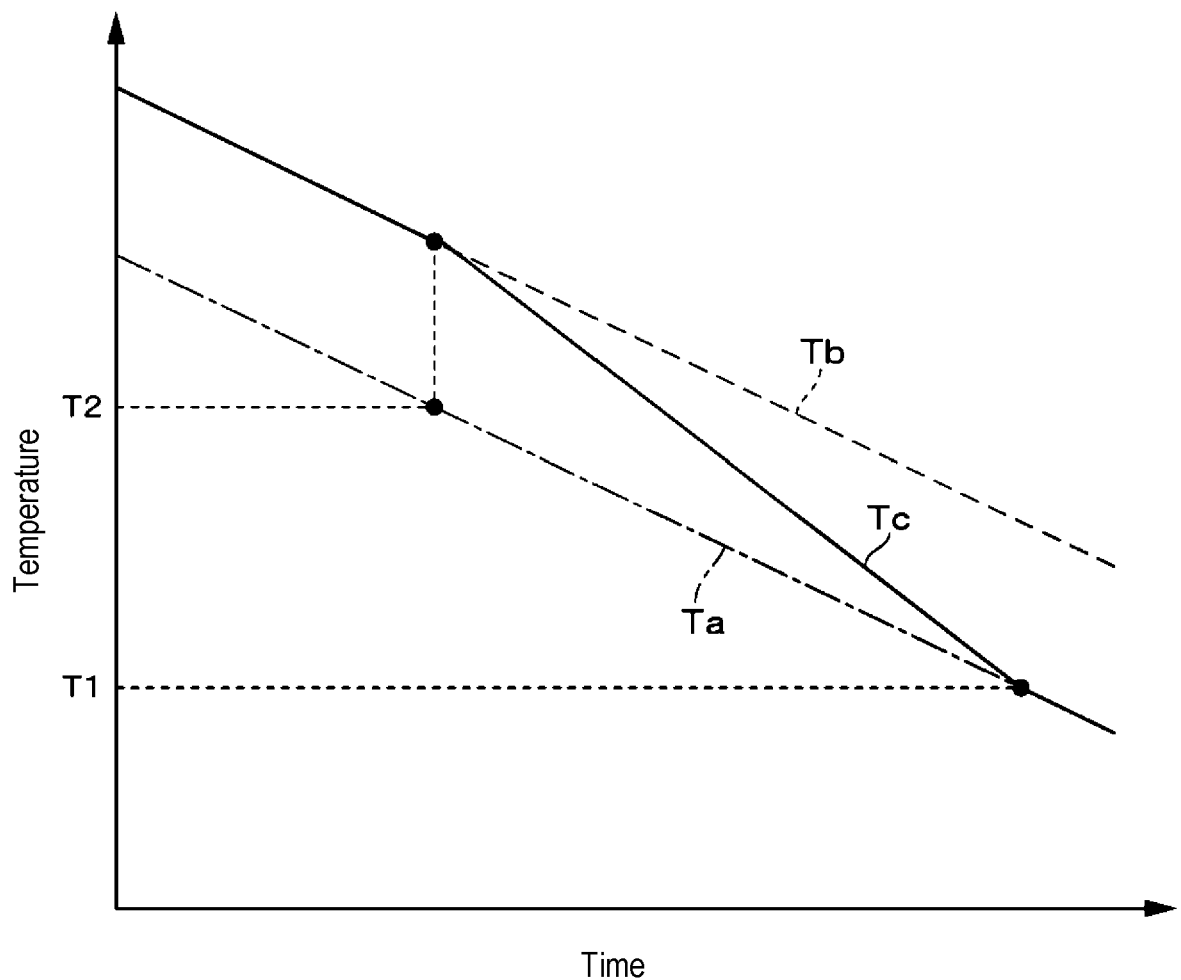
FIG. 13 is a second characteristic graph illustrating an operation of the film forming apparatus.
Figure 14:
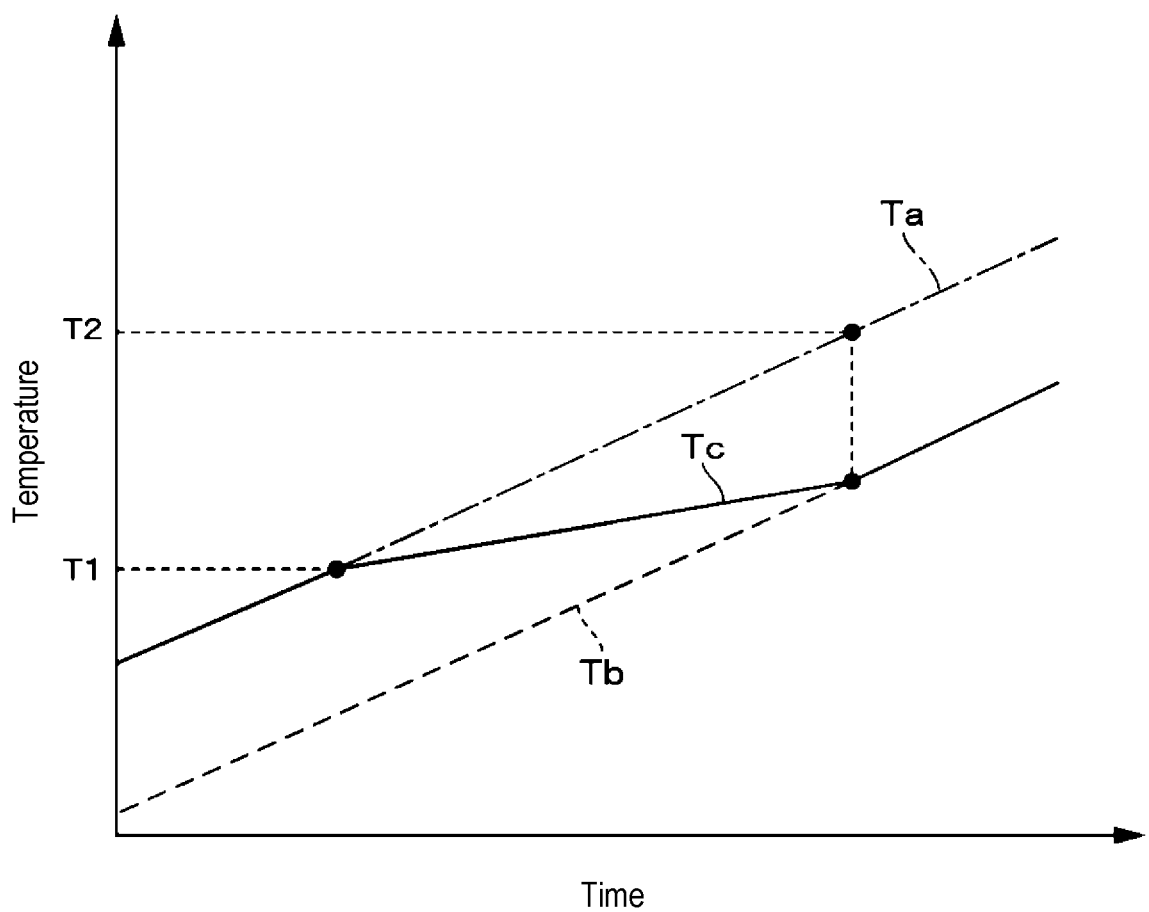
FIG. 14 is a third characteristic graph illustrating an operation of the film forming apparatus.
Figure 15:
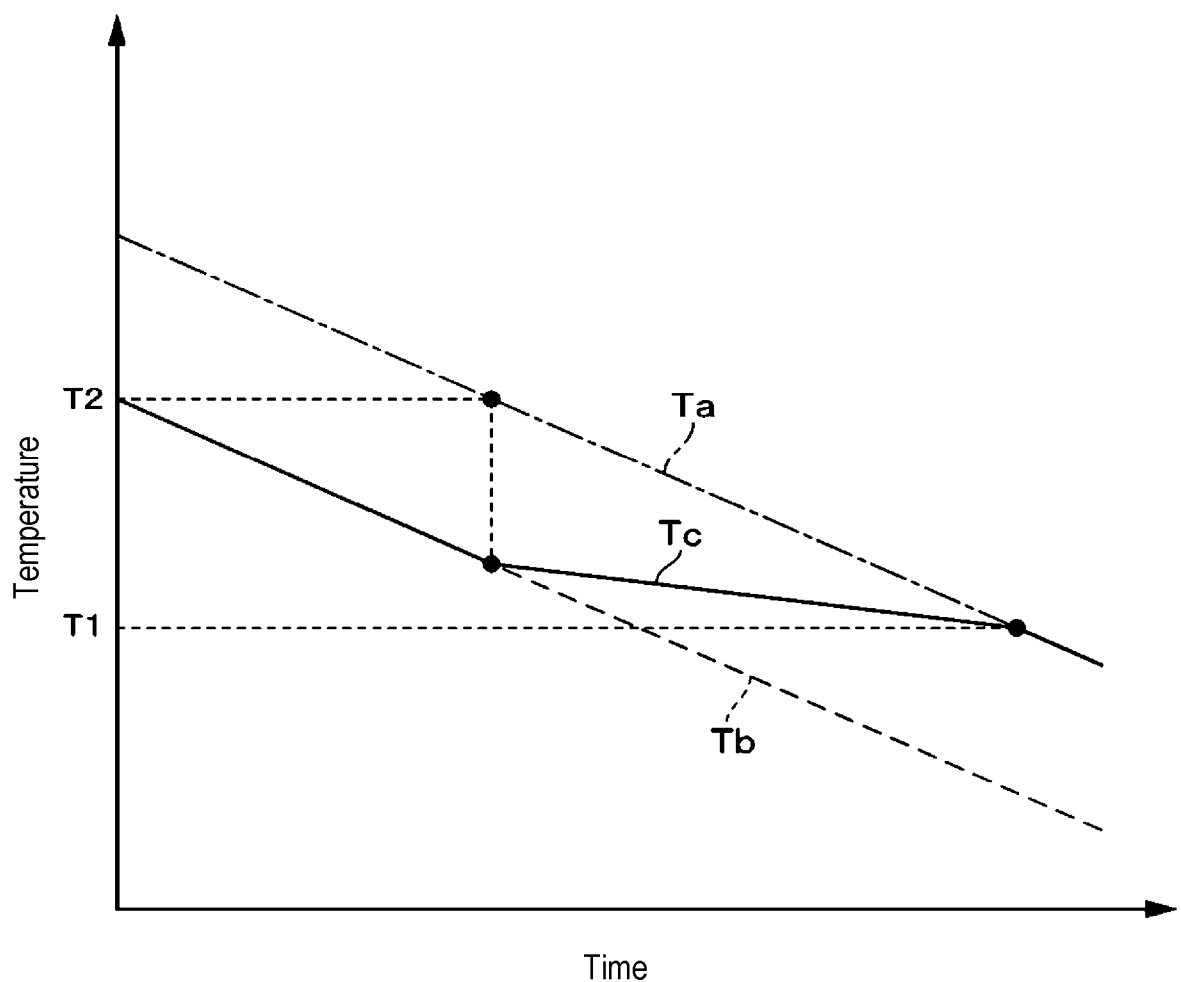
FIG. 15 is a fourth characteristic graph illustrating an operation of the film forming apparatus.

FIG. 13 illustrates an example in which the temperature detection value Ta is detected to be lower than the TCR-based calculation temperature Tb when the preset temperature is lowered linearly with time. FIG. 14 illustrates an example in which the temperature detection value Ta is detected to be higher than the TCR-based calculation temperature Tb when the preset temperature is raised linearly with time. FIG. 15 illustrates an example in which the temperature detection value Ta is detected to be higher than the TCR-based calculation temperature Tb when the preset temperature is lowered linearly with time.

Even in these examples, in the temperature range in which the TCR-based calculation temperature Tb is higher than the second temperature T2, the heating control is performed based on the TCR-based calculation temperature Tb, and in the temperature range in which the temperature detection value Ta is lower than the first temperature T1, the heating control is performed based on the temperature detection value Ta. In the temperature range in which the weighted average temperature ranges from the first temperature T1 to the second temperature T2, the power to be supplied to the heater 4 is controlled based on the weighted average temperature T' calculated using Equation (1) above. As a result, the power to be supplied to the heater 4 is controlled while linearly raising and lowering the control temperature TC between the first temperature T1 and the second temperature T2.

According to this embodiment, when performing the heating process with respect to the wafer W placed on the stage 2 using the heater 4, it is possible to control the temperature of the stage 2 with high accuracy in a wide temperature range. In this example, in the temperature range lower than the switching temperature, the power control is performed through the phase control based on the detection result of the heating temperature (the temperature detection value) detected by the temperature detector (the thermocouple 5). As described above, in the low temperature range, the control method preferably uses the phase control, and thus the accuracy of the temperature detection value is high.

Meanwhile, in the high temperature range, the power control is performed through the zero-cross control based on the TCR-based calculation temperature Tb. As described above, in the high temperature range, the control method preferably uses the zero-cross control. Thus, even in the second region 23 in which the thermocouple 5 is not provided, it is possible to perform the temperature control with high accuracy using the TCR-based calculation temperature. In this way, the method of acquiring the heating temperature and the method of controlling the power to be supplied to the heater 4 are changed in the low temperature range lower that the switching temperature and the high temperature range higher than the switching temperature. Therefore, it is possible to perform the acquisition of the heating temperature and the control of the power to be supplied to the heater 4 with higher accuracy according to the temperature range. As a result, it is possible to control the temperature of the stage 2 with high accuracy in a wide temperature range.

In addition, in the case of switching the power control based on the first temperature and the second temperature instead of the switching temperature, the power control is performed through the phase control based on the temperature detection value in the temperature range in which the heating temperature is lower than the first temperature, and the power control is performed through the zero-cross control based on the TCR-based calculation temperature in the temperature range in which the heating temperature is higher than the second temperature. In the range of the switching temperature between the first temperature and the second temperature, the power control is performed through the zero-cross control based on the transition temperature between the temperature detection value and the TCR-based calculation temperature. Since the transition temperature is set in the range of the switching temperature in this way, the power control at the time of switching between the first temperature and the second temperature becomes stable.

That is, the temperature detector and the temperature calculator have different temperature ranges in each of which a temperature can be measured with high accuracy. Thus, when these ranges are switched without any measure, a deviation in acquired temperature may occur therebetween. It has been found that, when a deviation occurs in the acquired temperature, severe hunting of the output of the heater 4 may occur. For example, when the TCR-based calculation temperature of the temperature calculator is lower than the temperature detection value of the temperature detector, the output of the heater 4 rapidly increases in order to match the TCR-based calculation temperature with the preset temperature. Along with this, when the TCR-based calculation temperature is sharply raised, the output of the heater 4 is sharply reduced in order to match the TCR-based calculation temperature with the preset temperature. Such a large fluctuation of the output of the heater 4 repeatedly occurs until the TCR-based calculation temperature becomes stable. When the hunting of the output of the heater occurs, thermal stress is repeatedly generated in the stage 2, which causes damage or breakage.

In the present disclosure, the weighted average temperature of the temperature detection value and the TCR-based calculation temperature is adopted as the transition temperature, and the output of the heater 4 is controlled based on the weighted average temperature. The weight applied to the weighted average temperature is changed such that the closer the weighted average temperature is to the first temperature, the more the proportion of the temperature detection value increases, and the closer the weighted average temperature is to the second temperature, the more the proportion of the TCR-based calculation temperature increases. Therefore, since the weighted average temperature, which is a control temperature, gradually transits from the first temperature to the second temperature, a sudden change in the control temperature is suppressed. This reduces a possibility that hunting occurs in the output of the heater 4, which makes it possible to stably control the output of the heater 4. In addition, it is possible to suppress the occurrence of damage to the stage 2, which is caused by thermal stress due to hunting. In this way, it is possible to stably control the output of the heater 4 from a temperature lower than the first temperature to a temperature higher than the second temperature, which makes it possible to control the temperature of the stage 2 with high accuracy.

In addition, when the weight of the weighted average temperature is linearly changed as in Equation (1) above, the weighted average temperature changes linearly in the temperature range between the first temperature and the second temperature. This makes the transition of the control temperature smoother, thus more stably controlling the output of the heater.

Furthermore, in the temperature range in which the heating temperature of the first region 22 is lower than the switching temperature, the power control for the outer heater 42 is performed through the phase control based on the result of the power control for the inner heater 41. Depending on the material and structure of the stage 2, a location where the thermocouple 5 is installed may be limited to the central portion, but even in such a case, it is possible to control the power to be supplied to the outer heater 42 with high accuracy. In addition, since the temperature detector is provided only in the first region 22, it is possible to suppress an increase in the number of temperature detectors and to simplify the configuration of the apparatus.

In the foregoing, for example, the temperature calculator 611 may be configured to calculate the weighted average temperature T' based on the following Equation (2). Equation (2) is an example in which the weight of the weighted average temperature is linearly changed according to the change in the TCR-based calculation temperature Tb. Even in this case, the weight of the weighted average temperature is changed such that the closer the weighted average temperature is to the first temperature T1, the more the proportion of the temperature detection value Ta increases, and the closer the weighted average temperature is to the second temperature T2, the more the proportion of the TCR-based calculation temperature Tb increases.

$$T'=\{1-(Tb-T1)/(T2-T1)\}Ta+\{(Tb-T1)/(T2-T1)\}Tb \quad (2)$$

In the example described above, the temperature calculator 611 is configured to linearly change the weight of the weighted average temperature, but the calculation of the weighted average temperature is not limited to Equations (1) and (2) above. For example, the weight of the weighted average temperature may be changed in a non-linear manner along a curve or the like.

In addition, in the temperature range from the first temperature to the second temperature, the power to be supplied to the heater 4 may be controlled at least when the substrate is heated in the heating process.

The temperature detector configured to detect the heating temperature of the wafer W by the heater is not limited to the thermocouple, and may be appropriately selected according to the processing temperature of the heating process. For example, as the temperature detector, a pyrometer, or the like that measures the temperature based on the result of detection of heat radiation may be used.

It is not always necessary to set the transition temperature between the temperature range lower than the switching temperature and the temperature range higher than the switching temperature. For example, when the problem of hunting described above is determined to be insignificant, the heating temperature acquisition method and the power control method may be switched with reference to the switching temperature. In addition, when the control is performed based on the transition temperature, the power to be supplied to the heater 4 may be controlled through the phase control, instead of the zero-cross control, depending on the processing temperature of the heating process.

Although the temperature-dependent changes of TCRs of resistance heating elements constituting the heater 4 are illustrated in FIG. 3 described above, the resistance heating element may be made of a metal other than the metal described with reference to FIG. 3. In addition, the metal constituting the inner heater and the metal constituting the outer heater may be of different types. In the temperature-dependent changes of TCRs illustrated in FIG. 3, the larger a level (slope) of the temperature-dependent changes of TCRs, the resolution becomes higher and the measurement accuracy of the resistance value becomes higher. In this example, the slope of nickel is the largest, but as described above, the slope of temperature-TCR curve tends to be gentle in a higher temperature region. Therefore, when the slope of tungsten or molybdenum becomes larger in such a temperature region, the outer heater may be configured using a metal other than nickel.

The substrate heating apparatus of the present disclosure is not limited to the apparatus of the above-described embodiment, and the configuration of the heater may be appropriately set. In addition, the heating process performed on the substrate includes an etching process or the like in addition to a film forming process and a modifying process. Moreover, the substrate to which the present disclosure is applicable is not limited to a semiconductor wafer W. For example, the substrate may be a glass substrate of a flat panel display (FPD).

According to the present disclosure, when heating a substrate placed on the stage using a resistance heater, it is possible to control a temperature of the stage with high accuracy in a wide temperature range.

It should be understood that the embodiments disclosed herein are illustrative and are not limited in all aspects. The embodiments described above may be omitted, replaced, or modified in various forms without departing from the scope and spirit of the appended claims.

What is claimed is:

1. An apparatus for heating a substrate, comprising:
a stage on which the substrate is placed and including at least one resistance heater configured to heat the substrate;
a temperature detector configured to detect a heating temperature of the substrate heated by the at least one resistance heater;
a temperature calculator configured to calculate the heating temperature based on a resistance value of the at least one resistance heater, which is obtained from a current value and a voltage value of a power supplied to the at least one resistance heater;
a power controller configured to perform a power control with respect to a first power to be supplied to the at least one resistance heater such that the heating temperature is adjusted towards a first preset temperature by applying a phase control and a zero-cross control in a switching manner with respect to a power output from an alternate current (AC) power supply; and
a controller,
wherein the controller is configured to:
switch the power control of the power controller such that, in a low temperature range in which the heating temperature is lower than a preset switching temperature, the power control is performed through the phase control based on a detection result of the heating temperature detected by the temperature detector and, in a high temperature range in which the heating temperature is higher than the preset switching temperature, the power control is performed through the zero-cross control based on a calculation result of the heating temperature calculated by the temperature calculator.

2. The apparatus of claim 1, wherein the controller is configured to:
switch the power control of the power controller with reference to a first temperature, which is an upper limit temperature in the low temperature range, and a second temperature, which is a lower limit temperature in the high temperature range and is higher than the first temperature, instead of the preset switching temperature; and
in a switching temperature range between the first temperature and the second temperature, control the power controller to perform the power control through one of the phase control and the zero-cross control based on a transition temperature between the detection result of the heating temperature detected by the temperature detector and the calculation result of the heating temperature calculated by the temperature calculator.

3. The apparatus of claim 2, wherein the transition temperature is a weighted average temperature of the detection result of the heating temperature detected by the temperature detector and the calculation result of the heating temperature calculated by the temperature calculator, and is a temperature obtained by changing a weight of the weighted average temperature such that the closer the weighted average temperature is to the first temperature, the more a proportion of the detection result of the heating temperature detected by the temperature detector increases and the closer the weighted average temperature is to the second temperature, the more a proportion of the calculation result of the heating temperature calculated by the temperature calculator increases.

4. The apparatus of claim 1, wherein the at least one resistance heater provided in the stage includes: a first resistance heater configured to heat a first region corresponding to a central region of the substrate; and a second resistance heater configured to heat a second region corresponding to a peripheral region of the substrate which is different from the first region,
the power controller is configured to perform the power control with respect to a second power to be supplied to the second resistance heater by applying the phase control and the zero-cross control in a switching manner to the second resistance heater,
the temperature detector is provided at a position where a heating temperature of the first region is detected,
the temperature calculator is configured to calculate a heating temperature of the second region based on a resistance value of the second resistance heater, which is obtained from a current value and a voltage value of the second power to be supplied to the second resistance heater, and
the controller is configured to:
switch the power control of the power controller such that, in a low temperature range in which the heating temperature of the first region detected by the temperature detector is lower than the preset switching temperature, the power control is performed for the second resistance heater through the phase control based on a result of the power control for the first resistance heater and, in a high temperature range in which the heating temperature of the first region is higher than the preset switching temperature, the power control is performed through the zero-cross control based on the calculation result of the heating temperature of the second region calculated by the temperature calculator such that the heating temperature of the second region is adjusted towards a second preset temperature previously set for the second region.

5. The apparatus of claim 4, wherein the controller is configured to:
switch the power control of the power controller for the second resistance heater with reference to a first temperature, which is an upper limit temperature in the low temperature range, and a second temperature, which is a lower limit temperature in the high temperature range and is higher than the first temperature, instead of the preset switching temperature; and
in a switching temperature range between the first temperature and the second temperature, based on a transition temperature between a temperature obtained from the detection result of the heating temperature of the first region detected by the temperature detector and the calculation result of the heating temperature of the second region calculated by the temperature calculator, control the power controller to perform the power control for the second resistance heater through one of the phase control and the zero-cross control such that the transition temperature is adjusted towards the second set temperature.

6. The apparatus of claim 5, wherein the transition temperature is a weighted average temperature of a temperature obtained from the detection result of the heating temperature of the first region detected by the temperature detector and the calculation result of the heating temperature of the second region calculated by the temperature calculator, and is a temperature obtained by changing a weight of the weighted average temperature such that the closer the weighted average temperature is to the first temperature, the more a proportion of the temperature obtained from the detection result of the heating temperature detected by the temperature detector increases and the closer the weighted average temperature is to the second temperature, the more a proportion of the calculation result of the heating temperature calculated by the temperature calculator increases.

7. A method of heating a substrate, the method comprising:
heating a substrate placed on a stage using at least one resistance heater provided in the stage;
detecting, by a temperature detector, a heating temperature of the substrate heated by the at least one resistance heater;
calculating the heating temperature based on a resistance value of the at least one resistance heater, which is obtained from a current value and a voltage value of a power supplied to the at least one resistance heater; and
performing a power control with respect to a first power to be supplied to the at least one resistance heater such that the heating temperature is adjusted towards a preset temperature by applying a phase control and a zero-cross control in a switching manner to a power output from an alternate current (AC) power supply,
wherein in the performing the power control, in a low temperature range in which the heating temperature is lower than a preset switching temperature, the power control is performed through the phase control based on a detection result of the heating temperature in the detecting the heating temperature and, in a high temperature range in which the heating temperature is higher than the preset switching temperature, the power control is performed through the zero-cross control based on a calculation result of the heating temperature in the calculating the heating temperature.

8. The method of claim 7, further comprising:
switching the power control in the performing the power control with reference to a first temperature, which is an upper limit temperature in the low temperature range, and a second temperature, which is a lower limit temperature in the high temperature range and is higher than the first temperature, instead of the preset switching temperature; and
in a switching temperature range between the first temperature and the second temperature, executing the power control through one of the phase control and the zero-cross control based on a transition temperature between the detection result of the heating temperature in the detecting the heating temperature and the calculation result of the heating temperature in the calculating the heating temperature.

9. The method of claim 8, wherein the transition temperature is a weighted average temperature of the detection result of the heating temperature in the detecting the heating temperature and the calculation result of the heating temperature in the calculating the heating temperature, and is a temperature obtained by changing a weight of the weighted average temperature such that the closer the weighted average temperature is to the first temperature, the more a proportion of the detection result of the heating temperature in the detecting the heating temperature increases, and the closer the weighted average temperature is to the second temperature, the more a proportion of the calculation result of the heating temperature in the calculating the heating temperature increases.

10. The method of claim 7, wherein the at least one resistance heater provided in the stage includes: a first resistance heater configured to heat a first region corresponding to a central region of the substrate; and a second resistance heater configured to heat a second region corresponding to a peripheral region of the substrate which is different from the first region,
- in the heating the substrate, the substrate is heated by the second resistance heater in addition to the first resistance heater,
- in the performing the power control, a second power to be supplied to the second resistance heater is controlled by applying the phase control and the zero-cross control in a switching manner to the second resistance heater,
- in the detecting the heating temperature, a heating temperature of the first region is detected,
- in the calculating the heating temperature, a heating temperature of the second region is calculated based on a resistance value of the second resistance heater, which is obtained from a current value and a voltage value of the second power to be supplied to the second resistance heater, and
- in the performing the power control, in a low temperature range in which the heating temperature of the first region detected in the detecting the heating temperature is lower than the preset switching temperature, the power control is performed for the second resistance heater through the phase control based on a result of the power control performed for the first resistance heater and, in a high temperature range in which the heating temperature of the first region is higher than the preset switching temperature, the power control is performed through the zero-cross control based on the calculation result of the heating temperature in the calculating the heating temperature of the second region such that the heating temperature of the second region is adjusted towards a second preset temperature previously set for the second region.

11. The method of claim 10, further comprising:
- executing the switching of the power control in the performing the power control with respect to the second resistance heater with reference to a first temperature, which is an upper limit temperature in the low temperature range, and a second temperature, which is a lower limit temperature in the high temperature range and is higher than the first temperature, instead of the preset switching temperature; and
- in a switching temperature range between the first temperature and the second temperature, based on a transition temperature between a temperature obtained from the detection result of the heating temperature of the first region in the detecting the heating temperature and the calculation result of the heating temperature in the calculating the heating temperature of the second region, the performing the power control includes performing the power control with respect to the second resistance heater through one of the phase control and the zero-cross control such that the transition temperature is adjusted towards the second set temperature.

12. The method of claim 11, wherein the transition temperature is a weighted average temperature of a temperature obtained from the detection result of the heating temperature of the first region in the detecting the heating temperature and the calculation result of the heating temperature in the calculating the heating temperature of the second region, and is a temperature obtained by changing a weight of the weighted average temperature such that the closer the weighted average temperature is to the first temperature, the more a proportion of the temperature obtained from the detection result of the heating temperature in the detecting the heating temperature increases, and the closer the weighted average temperature is to the second temperature, the more a proportion of the calculation result of the heating temperature of the second region in the calculating the heating temperature increases.

* * * * *